US007479361B2

(12) United States Patent
Nagahara et al.

(10) Patent No.: US 7,479,361 B2
(45) Date of Patent: Jan. 20, 2009

(54) CHEMICALLY AMPLIFIED RESIST COMPOSITION, PROCESS FOR MANUFACTURING SEMICONDUCTOR DEVICE AND PATTERNING PROCESS

(75) Inventors: Seiji Nagahara, Kawasaki (JP); Masayuki Hiroi, Kawasaki (JP)

(73) Assignee: Nec Electronics Corporation, Kanagawa (JP)

( * ) Notice: Subject to any disclaimer, the term of this patent is extended or adjusted under 35 U.S.C. 154(b) by 130 days.

(21) Appl. No.: 10/868,968

(22) Filed: Jun. 17, 2004

(65) Prior Publication Data
US 2004/0259373 A1 Dec. 23, 2004

(30) Foreign Application Priority Data
Jun. 20, 2003 (JP) ............................. 2003-176736

(51) Int. Cl.
G03F 7/00 (2006.01)
(52) U.S. Cl. .................. 430/270.1; 430/286.1; 430/330
(58) Field of Classification Search ................ 252/79.1, 252/79.4; 430/270.1, 330, 270; 438/694, 438/725
See application file for complete search history.

(56) References Cited
U.S. PATENT DOCUMENTS 5,525,453 A 6/1996 Przybilla et al.
6,048,672 A 4/2000 Cameron et al.
6,251,558 B1 6/2001 Elian et al.
6,319,649 B1 11/2001 Kato et al.
6,800,551 B2 10/2004 Nagahara et al.
6,921,621 B2 7/2005 Nitta et al.
6,936,398 B2* 8/2005 Fedynyshyn ............. 430/270.1
2002/0031729 A1* 3/2002 Trefonas et al. ............. 430/322

FOREIGN PATENT DOCUMENTS

| JP | 06-242605 | 9/1994 |
| JP | 08-110638 | 4/1996 |
| JP | 10-301286 | 11/1998 |
| JP | 11-282168 | 10/1999 |
| JP | 2000-137328 | 5/2000 |
| JP | 2000-330284 | 11/2000 |
| JP | 2003-122009 | 4/2003 |
| JP | 2003-167345 | 6/2003 |

* cited by examiner

Primary Examiner—Nadine Norton
Assistant Examiner—Maki Angadi
(74) Attorney, Agent, or Firm—Young & Thompson

(57) ABSTRACT

An objective of this invention is to prevent resist poisoning and sensitivity deterioration in a chemically amplified resist. The chemically amplified resist comprises a base resin, a photoacid generator and a salt exhibiting buffer effect in the base resin.

7 Claims, 8 Drawing Sheets

| | (a) | (b) | (c) |
|---|---|---|---|
| Sensitivity | 52mJ | 310mJ | 40mJ |
| Exposure margin (CD ± 10%) | 11% | 15% | 16% |

CHEMICALLY AMPLIFIED RESIST COMPOSITION, PROCESS FOR MANUFACTURING SEMICONDUCTOR DEVICE AND PATTERNING PROCESS

BACKGROUND OF THE INVENTION

1. Field of the Invention

This invention relates to a chemically amplified resist composition, a process for manufacturing a semiconductor device and a patterning process.

2. Description of the Prior Art

As a device has become more compact and more accelerated, lithography using a short-wavelength light source has been employed because of improving resolution. In addition, there has been used a chemically amplified resist as a resist material.

Furthermore, the needs for size reduction and acceleration in a semiconductor device require using, besides a copper (Cu) interconnection, a so-called low dielectric constant material. A copper interconnection is generally formed by a damascene process in which a trench for an interconnection is formed on an insulating film between interconnections, the trench is filled with copper and then excessive copper in an unwanted area outside the interconnection trench is removed by chemical mechanical polishing (CMP).

There will be described formation of a copper interconnection by a damascene process using a chemically amplified resist. FIG. 10 is process cross-sections showing the procedure of a dual damascene process where a via-hole and an interconnection trench are simultaneously filled. A process where the interconnection and the via are formed by a so-called via-first process.

First, on a lower interconnection layer 108 are sequentially deposited a first etching stopper film 107, a first interlayer insulating film 106, a second etching stopper film 105, a second interlayer insulating film 104 and a third interlayer insulating film 103. Then, using well-known lithography and etching technique, a via-hole 111 is formed in the third interlayer insulating film 103, the second interlayer insulating film 104, the second etching stopper film 105 and the first interlayer insulating film 106 (FIG. 10(a)).

Then, an anti-reflection film 102 is formed on the third interlayer insulating film 103 and the first etching stopper film 107, during which the via-hole 111 is partly or totally buried with the anti-reflection film 102. This figure shows that the via-hole 111 is partly buried with the anti-reflection film 102 (FIG. 10(b)).

Next, on the anti-reflection film 102 is applied a chemically amplified resist 201 (FIG. 10(c)). Then, in the chemically amplified resist 201 is formed an opening pattern 112 for forming an interconnection trench connected to the via-hole 111 (FIG. 10(d)).

Subsequently, using the chemically amplified resist 201 as a mask, the anti-reflection film 102 on the third interlayer insulating film 103, and then the third interlayer insulating film 103 and the second interlayer insulating film 104 are etched off to form an interconnection trench 113 (FIGS. 10(e) and (f)).

Then, the chemically amplified resist 201 and the anti-reflection film 102 are stripped off by $O_2$ plasma ashing and using an organic stripper. Next, the first etching stopper film 107 at the bottom of the via-hole 111 is etched off to provide a structure where the via-hole 111 is connected to the upper surface of the interconnection (not shown) in the lower interconnection layer 108 (FIG. 10(g)).

Next, a metal film is formed such that it buries the interconnection trench 113 and the via-hole 111. The metal film can be formed by first forming a barrier metal film within the interconnection trench 113 and the via-hole 111 by sputtering and then burying the interconnection trench 113 and the via-hole 111 with an interconnection metal film by, for example, electroplating. Subsequently, unwanted barrier metal and interconnection metal films outside the interconnection trench 113 are removed by CMP to form an interconnection 109 (FIG. 10(h)).

In such a via-first process, defective resolution of the resist on the via-hole 111 tends to occur during forming the opening pattern 112 in the chemically amplified resist 201. Such a phenomenon that defective resolution is induced in a particular area not due to a lower optical resolution, but due to an external factor inhibiting resolution of a chemically amplified resist is called "resist poisoning". If resist poisoning occurs, an interlayer insulating film cannot be processed into a desired shape. Furthermore, when directly forming an interconnection, interconnection-defects such as stress-migration and electro-migration may occur, leading to a less reliable semiconductor device.

To solve the problem, it has been proposed that a resist composition comprising an organic base is used for preventing resist poisoning of a resist pattern (Tokkai2000-137328). Tokkai2000-137328 has described that addition of an organic base is effective for preventing dimensional fluctuation of a resist pattern because diffusion or activity of an acid after exposure is inhibited. Hereinafter, an organic base used for such a purpose is referred to as a "quencher".

However, when adding a quencher to a resist composition, it is effective for preventing resist poisoning during resist patterning, but it may lead to deteriorate in resist sensitivity. A resist with excessively lower sensitivity may reduce a throughput in an exposure process and thus may sometimes lead to significantly deteriorated mass productivity. For example, a three-fold amount of the quencher requires an almost three-fold exposure time. Thus, when adding a sufficient amount of the quencher to completely prevent poisoning, an exposure time frequently exceed a permissible limit. Furthermore, in a lithography process with a lower throughput such as EB direct-drawing lithography, it is difficult to increase the amount of the quencher for preventing resist poisoning. Thus, the process cannot be sometimes employed due to resist poisoning.

In view of the situation, an objective of this invention is to provide a technique for preventing occurrence of poisoning and deterioration in sensitivity in a chemically amplified resist.

We have intensely investigated the above problems, conducting extensive experiments, and consequently have found the followings.

In a via-first process described above with reference to FIG. 10, it has been found that sensitivity in a chemically amplified resist may be lowered because of the mechanism described below. FIG. 11 is a process cross-section showing occurrence of defective formation of a chemically amplified resist on a via-hole.

First, by the above steps illustrated in FIGS. 10(a) to 10(c), a chemically amplified resist 201 is applied on an anti-reflection film 102. Then, an opening pattern 112 for forming an interconnection trench is transferred to the chemically amplified resist 201. In the process, as shown in FIG. 11(a), a chemically amplified resist 201 cannot be removed on and around the upper surface of the via-hole and partly remains (FIG. 11(a)).

Then, the anti-reflection film 102 is removed (FIG. 11(b)), and then the third interlayer insulating film 103 and the second interlayer insulating film 104 are etched off (FIG. 11(c)). In the process, as shown in FIG. 11(a), the chemically amplified resist 201 remains within the opening pattern 112, so that an interconnection trench 113 is not formed in conformity to a pattern and a residual fence 114 of the third interlayer insulating film 103 and the second interlayer insulating film 104 is formed on and around the upper surface of the via-hole. The residual fence 114 is not removed by subsequent $O_2$ plasma ashing or treatment with an organic stripper (FIG. 11(d)), and remains in the interconnection trench 113 (FIG. 11(e)).

We have further analyzed the cause of a defective pattern in the above process and have obtained a new finding described below. Specifically, it has been found that an amine or its analogue is formed in an interlayer insulating film formed on a semiconductor substrate and the compound is subjected to neutralization with an acid catalyst in a chemically amplified resist, leading to deteriorated sensitivity of a resist.

A variety of sources may be deduced for such an amine; for example, a nitrogen-containing film formed under a resist, NOx in a deposition gas used for, e. g., depositing a silicon oxide film, or an amine present in a stripper used for removing a resist.

SUMMARY OF THE INVENTION

We have also investigated relationship between tendency to poisoning and the type of an insulating film and have found that poisoning tends to occur when using a low dielectric-constant film with a specific dielectric constant of 3 or less. Although the reason has not clearly understood, it may be assumed that such a film has a more porous structure in comparison with, for example, an $SiO_2$ film formed by plasma CVD and thus an amine tends to be easily occluded in the film.

Based on the new findings above described, we have concluded that it is essential to reduce influence of an amine compound present in a system for minimizing deterioration of resist sensitivity. Further continuing investigation in the light of the concept, we have demonstrated that a salt exhibiting buffer effect can be added to a resist composition to minimize influence of an amine compound and thus to form a stable resist pattern capable of stably preventing poisoning from occurring while maintain higher sensitivity.

This invention provides a chemically amplified resist composition comprising a base resin; a photoacid generator which generates an acid by exposure; and a salt exhibiting buffer effect in the base resin.

The term, "buffer effect" as used herein means an action of inhibiting fluctuation of a proton concentration in a resist, and keeping the proton concentration constant. When being solidified, a resist composition comprising such a salt exhibits equivalent buffering behavior in the solid as if the composition is in an aqueous liquid, so that fluctuation of a proton concentration in a resist is insusceptible to variation of an acid or base concentration.

The resist composition according to this invention comprises a salt exhibiting buffer effect. Thus, an acid generated from a photoacid generator can be effectively utilized without excessive consumption to maintain higher resist sensitivity. Furthermore, it can prevent fluctuation of the amount of an acid present in a system due to invasion of, for example, an external amine. That is, fluctuation of sensitivity or resolution in a resist due to external factors can be minimized. In addition, the amount of an acid in a system can be kept constant, so that a resist having a wide exposure margin can be obtained.

A salt exhibiting buffer effect herein is a substance different from a photoacid generator. A photoacid generator is a substance which can be decomposed by light irradiation to consequently generate an acid, while a salt exhibiting buffer effect can generate an acid-base pair in a resist composition without light irradiation, and thus can behave as if it is a buffer.

This invention also provides a process for manufacturing a semiconductor device, comprising the steps of forming a film to be etched on a semiconductor substrate; on the film to be etched, forming a first resist film patterned in a predetermined shape and using the first resist film as a mask, etching the film to be etched to form a concave; removing the first resist film; on the film to be etched, applying a chemically amplified resist composition, which is then dried to form a second resist film; patterning the second resist film to form an opening such that at least part of the region where the concave has been formed is exposed; and etching the film to be etched or a film formed over or below the film, using the patterned second resist film as a mask; wherein the chemically amplified resist composition comprises a base resin; a photoacid generator which generates an acid by exposure; and a salt exhibiting buffer effect in the base resin.

This invention also provides a process for manufacturing a semiconductor device, comprising the steps of forming a film to be etched on a semiconductor substrate; applying a chemically amplified resist composition on the film to be etched and then drying the composition to form a resist film; patterning the resist film; and etching the film to be etched, using the patterned the resist film as a mask; wherein the chemically amplified resist composition comprises a base resin; a photoacid generator which generates an acid by exposure; and a salt exhibiting buffer effect in the base resin.

This invention also provides a process for forming a pattern, comprising the steps of applying a chemically amplified resist composition on a material to be etched and drying the composition to form a resist film; patterning the resist film; and etching and patterning the material to be etched, using the patterned resist film as a mask; wherein the chemically amplified resist composition comprises a base resin; a photoacid generator which generates an acid by exposure; and a salt exhibiting buffer effect in the base resin.

In a process according to this invention, a resist film comprising a salt exhibiting buffer effect in a base resin is used. Thus, deterioration in sensitivity during patterning can be minimized and a desired pattern can be reliably formed.

In this invention, a salt exhibiting buffer effect can be prepared by reaction between an acid and a base. Hereinafter, such an acid and a base are referred to as a "salt-forming acid" and a "salt-forming base", respectively. In this invention, a salt-forming acid may include an acid generated from the above photoacid generator by exposure. Thus, buffering action in a resist composition can be ensured to reliably improve sensitivity during patterning.

In this invention, the salt may be a sulfonate, which allows deterioration in a resist pattern to be further reliably inhibited.

In this invention, the salt may include a basic compound which can be used as a quencher. Herein, a basic compound which can be used as a quencher means a compound which inhibits diffusion of an acid generated from a photoacid generator in a resist film; for example, a nitrogen-containing basic compound. Such a basic compound may be used to minimize fluctuation of resolution in patterning and to form reliably a desired pattern. In this invention, the salt may be an amine. Thus, deterioration in sensitivity in a resist can be more reliably prevented.

In this invention, a salt of an alkanolamine with a sulfonic acid can be used as the salt. The sulfonic acid preferably may include benzenesulfonic acid, alkylsulfonic acid, camphorsulfonic acid and these substituted derivatives. Substituted derivatives include mono- and poly-substituted derivatives, those substituted with an organic group such as alkyl and alkoxy, and those substituted with a halogen such as fluorine, as well as those substituted with a fluoroalkyl. When introducing a substituent such as alkyl and alkoxy, it is preferable to select the proper carbon number. For example, a substituent with up to three carbon atoms may give a product having good handling properties.

A salt constituted with the above combination may be used to further reliably exert buffering action and thus to further reliably prevent sensitivity deterioration in lithography.

In this invention, an alkali solubility of the base resin may be varied by the action of the acid. In a negative resist, a generated acid causes a crosslinking reaction to form a site with a reduced solubility in a developer. In a positive resist, a generated acid dissociates a protective group in a resin to improve solubility. Thus, for example in a chemically amplified resist composition of this invention, the base resin may have an alkali-soluble group protected with a dissolution-inhibiting group and the dissolution-inhibiting group may be dissociated by the action of the acid to give an alkali-soluble resin. A resist composition according to this invention comprises a salt exhibiting buffer effect, so that when using such a base resin, fluctuation of alkali solubility due to variation in exposure can be prevented.

In a process for manufacturing a semiconductor device of this invention, the step of removing a first resist film may comprise removing a part of the first resist film using an amine stripper. In the manufacturing process of this invention, a second resist film comprising a salt exhibiting buffer effect is formed. Thus, deterioration in sensitivity can be reliably prevented when an amine component present in a stripper used for removing the first resist film remains in a film to be etched and permeates into the second resist film.

In a process for manufacturing a semiconductor device of this invention, the film to be etched may contain nitrogen. In a process for forming a pattern of this invention, the material to be etched may contain nitrogen. In a manufacturing process of this invention, a resist film comprising a salt exhibiting buffer effect is formed. Thus, deterioration in sensitivity can be reliably prevented when a nitrogen-containing basic compound derived from a film to be etched or an etching agent permeates into a resist film.

In a process for manufacturing a semiconductor device of this invention, the film to be etched may include a film having a porous structure with a specific dielectric constant of 3 or less. In a process for forming a pattern of this invention, the material to be etched may include a film having a porous structure with a specific dielectric constant of 3 or less.

Examples of a "film having a porous structure" include an HSQ film, an MSQ film, an MHSQ film, a ladder-like hydrogenated siloxane film, an SiLK® film, an SiOF film, an SiOC film, an SiON film and a benzocyclobutene film. These films have a relatively bulky substituent, so that they have a free volume larger than a compared with a non-porous film represented by an $SiO_2$ film and may, therefore, have a microporous structure. In such a film, an amine compound present in a system may tend to be occluded into the film.

Such a film having a porous structure tends to have a lower specific dielectric constant than a non-porous film. Any of the above-described films having a specific dielectric constant of 3 or less may have a microporous structure.

In this invention, a resist film comprising a salt exhibiting buffer effect is used. Thus, deterioration in sensitivity can be suitably prevented when an amine compound occluded into a film to be etched permeates into a resist film.

In this invention, a film to be etched may be a monolayer or multilayered film.

Although a configuration of this invention has been described, any appropriate combination of various components and modification of this invention to another category are effective as aspects of this invention. For example, a resist film formed by applying and drying the above chemically amplified resist composition or a wafer on which the resist film is applied may be effective as aspects of this invention.

Figure 1:
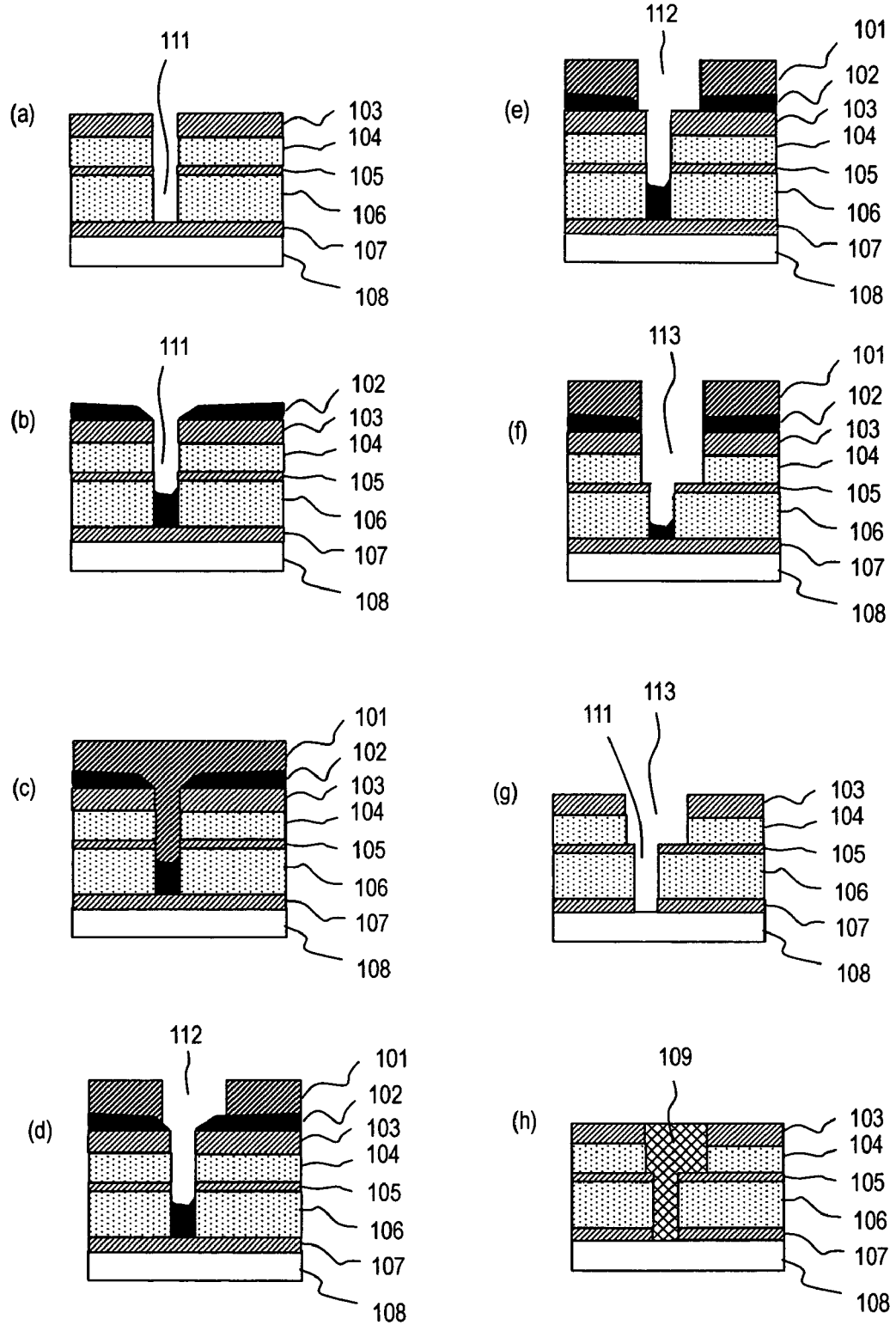
FIG. 1 is a cross-sectional view showing a process for manufacturing a semiconductor device according to an embodiment.

In these drawings, the symbols have the following meanings; 101: chemically amplified resist, 102: anti-reflection film, 103: third interlayer insulating film, 104: second interlayer insulating film, 105: second etching stopper film, 106: first interlayer insulating film, 107: first etching stopper film, 108: lower interconnection layer, 109: interconnection, 111: via-hole 112: opening pattern, 113: interconnection trench, 114: residual fence, 115: interlayer insulating film, 116: first resist film, 117: second resist film, 118: third resist film, 119: opening pattern, 120: barrier metal film, 121: copper film, 122: opening pattern, and 201: chemically amplified resist.

DETAILED DESCRIPTION OF PREFERRED EMBODIMENTS

There will be described components constituting a chemically amplified resist according to this invention.

In this invention, a base resin used is a resin whose alkali solubility varies by the action of an acid and which is transparent at a wavelength of a light source used in lithography. A material having a side chain susceptible to acid hydrolysis is used, to ensure an adequate solubility difference in a developing solution before and after exposure.

Specifically, it may be appropriately selected from known materials commonly used for a chemically amplified resist. For example, a positive resist composition can comprise a base resin having an acidic functional group protected with a dissolution-inhibiting group which is alkali-insoluble or alkali-poorly-soluble and which becomes alkali-soluble after removing the dissolution-inhibiting group. A negative resist composition may comprise an alkali-soluble base resin which becomes alkali-poorly-soluble by crosslinking by the action of a crosslinking agent. The term, "alkali-insoluble" or "alkali-poorly-soluble" as used herein means that dissolution rate in a 2.38 wt % aqueous solution of TMAH (tetramethylammonium hydroxide) is less than 20 Å/sec while "alkali-soluble" means that it is from 20 to 300 Å/sec.

Examples of a base resin for a KrF excimer laser resist at a wavelength of 248 nm, an EUV resist at a wavelength of 3 to 20 nm, an EB resist or a X-ray resist include polyhydroxystyrene (PHS), and a copolymer of hydroxystrene with one or more monomers such as styrene, (meth)acrylates and the like. Examples of a base resin for an ArF excimer laser resist at a wavelength of 193 nm include poly(meth)acrylates, alternating copolymers of norbornene and maleic anhydride, polynorbornenes and metathesis ring-opened polymers. Examples of a base resin for an $F_2$ excimer laser at a wavelength of 157 nm include the above-mentioned polymers which are fluorinated. However, the base resin is not limited to these polymers.

The term, "(meth)acrylic acid" and (meth)acrylate" as used herein refers to methacrylic acid or acrylic acid, and methacrylate or acrylate, respectively. A base resin used in a positive resist composition is a base resin in which the hydrogen in a phenolic or carboxylic hydroxy group is replaced with a dissolution-inhibiting group. Generally, such replacement reduces a dissolution rate in an unexposed area.

A dissolution-inhibiting group in a base resin may be selected from a group of, for example, a tertiary alkyl group having 4 to 40 carbon atoms, a trialkylsilyl group having 1 to 6 carbon atoms, an oxoalkyl group having 4 to 20 carbon atoms and so on.

Specifically, examples of a dissolution-inhibiting group include, for example, tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl; straight or branched acetals such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-cyclohexyloxyethyl, 1-methoxypropyl, 1-ethoxypropyl, 1-methoxy-1-methylethyl and 1-ethoxy-1-methylethyl; and cyclic acetals such as tetrahydrofuranyl and tetrahydropyranyl, preferably 1-ethoxyethyl, 1-n-butoxyethyl and 1-ethoxypropyl.

Alternatively, 0.1% or more of hydrogen atoms in hydroxy groups in a base resin may be inter-molecularly or intra-molecularly crosslinked via a crosslinking group.

A weight-average molecular weight of a base resin is preferably about $5 \times 10^3$ to $1 \times 10^5$. A molecular weight of less than $5 \times 10^3$ may lead to insufficient coatability or resolution, while a molecular weight of more than $1 \times 10^5$ may lead to deteriorated resolution.

In this invention, a photoacid generator used may be a compound which generates an acid by irradiation of a high energy beam. Depending on the type of a light source, it may be appropriately selected from known materials. For example, for a KrF resist, it may be selected from a sulfonium salt, an iodonium salt, a sulfonyidiazomethanes and an N-sulfonyloxyimide type acid generator, which may be used alone or in combination of two or more.

A sulfonium salt is a salt of a sulfonium cation with a sulfonate. Examples of a sulfonium cation include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium and tribenzylsulfonium cations.

Examples of a sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate and methanesulfonate. A sulfonium salt as a combination of these may be used.

An iodonium salt is a salt of iodonium cation with a sulfonate. Examples of an iodonium cation include aryliodonium cations such as diphenyliodonium, bis(4-tert-butylphenyl)iodonium, 4-tert-butoxyphenylphenyliodonium and 4-methoxyphenylphenyliodonium.

Examples of a sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate and methanesulfonate. An iodonium salt as a combination of these may be used.

Examples of a sulfonyldiazomethane include bissulfonyldiazomethanes such as bis(ethylsulfonyl)diazomethane, bis (1-methylpropylsulfonyl)diazomethane, bis(2-methylpropylsulfonyl)diazomethane, bis(1,1-dimethylethylsulfonyl) diazomethane, bis(cyclohexylsulfonyl)diazomethane, bis (perfluoroisopropylsulfonyl)diazomethane, bis (phenylsulfonyl)diazomethane, bis(4-methylphenylsulfonyl) diazomethane, bis(2,4-dimethylphenylsulfonyl) diazomethane, and bis(2-naphthylsulfonyl)diazomethane, sulfonylcarbonyldiazomethanes such as 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and, tert-butoxycarbonyl-4-methylphenylsulfonyidiazomethane, and so on.

Examples of an N-sulfonyloxyimide type photoacid generator include a combination of a moiety of an imide such as succinimide, naphthalenedicarboxylic imide, phathalimide, cyclohexyldicarboxylic imide, 5-norbornene-2,3-dicarboxylic imide, 7-oxabicyclo[2.2.1]-5-heptene-2,3-dicarboxylic imide with a sulfonate such as trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate and methanesulfonate.

Examples of a benzoinsulfonate type photoacid generator include benzoin tosylate, benzoin mesylate and benzoin butanesulfonate.

Examples of a pyrogallol trisulfonate type photoacid generator include pyrogallol, phloroglucinol, catechol, resorcinol and hydroquinone derivatives, all of whose hydroxyl groups are replaced with an appropriate sulfonate such as trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate and methanesulfonate.

Examples of a nitrobenzylsulfonate type photoacid generator include 2,4-dinitrobenzylsulfonate, 2-nitrobenzylsulfonate and 2,6-dinitrobenzylsulfonate. Examples of a sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate and methanesulfonate. Alternatively, a compound whose nitro group substituted to the benzyl moiety is replaced with a trifluoromethyl group may be used as same as a nitro benzylsulfonate type photoacid generator.

Examples of a sulfone type photoacid generator include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-(cyclohexylcarbonyl)-2-(p-toluenesulfonyl)propane, 2,4-dimethyl-2-(p-toluenesulfonyl)pentan-3-one and so on.

Examples of a glyoxime derivative type photoacid generator include O,O'-bis(p-toluenesulfonyl)-α-dimethylglyoxime, O,O'-bis(p-toluenesulfonyl)-α-diphenylglyoxime, O,O'-bis(p-toluenesulfonyl)-α-dicyclohexylglyoxime, O,O'-bis(p-toluenesulfonyl)-2,3-pentanedioneglyoxime, O,O'-bis(p-toluenesulfonyl)-2-methyl-3,4-pentanedioneglyoxime, O,O'-bis(n-butanesulfonyl)-α-dimethylglyoxime, O,O'-bis(n-butanesulfonyl)-α-diphenylglyoxime, O,O'-bis(n-butanesulfonyl)-α-dicyclohexylglyoxime, O,O'-bis(n-butanesulfonyl)-2,3-pentanedioneglyoxime, O,O'-bis(n-butanesulfonyl)-2-methyl-3,4-pentanedioneglyoxime, O,O'-bis(methanesulfonyl)-α-dimethylglyoxime, O,O'-bis(trifluoromethanesulfonyl)-α-dimethylglyqxime, O,O'-bis(1,1,1-trifluoroethanesulfonyl)-α-dimethylglyoxime, O,O'-bis(tert-butanesulfonyl)-α-dimethylglyoxime, O,O'-bis(perfluorooctanesulfonyl)-α-dimethylglyoxime, O,O'-bis(cyclohexylsulfonyl)-α-dimethylglyoxime, O,O'-bis(benzenesulfonyl)-α-dimethylglyoxime, O,O'-bis(p-fluorobenzenesulfonyl)-α-dimethylglyoxime, O,O'-bis(p-tert-butylbenzenesulfonyl)-α-dimethylglyoxime, O,O'-bis(xylenesulfonyl)-α-dimethylglyoxime and O,O'-bis(camphorsulfonyl)-α-dimethylglyoxime.

Among others, a preferable photoacid generator is a sulfonium salt, a bissulfonyldiazomethane and an N-sulfonyloxyimide type photoacid generator.

Photoacid generators may be used alone or in combination of two or more.

A content of an acid generator is preferably 0.2 to 50 wt parts, particularly 0.5 to 40 wt parts to 100 wt parts of the total base resin. If it is less than 0.2 wt parts, an inadequate amount of an acid may be generated during exposure, leading to deteriorated sensitivity or resolution. If it is more than 50 wt parts, a transparency of a resist may be too low to provide adequate resolution.

A resist composition of this invention may contain a quencher, with which poisoning in a resist can be suitably prevented. A suitable quencher is a compound which reduces a diffusion rate of an acid generated from a photoacid generator in a resist film. Such a material can be added to reduce a diffusion rate of an acid in a resist film, resulting in improved resolution; to minimize fluctuation of sensitivity after exposure; and to minimize substrate- or environment-dependency to improve exposure margin or pattern profile.

A quencher is suitably a basic compound including ammonia; primary, secondary and tertiary aliphatic amines; mixed amines; aromatic amines; heterocyclic amines; nitrogen-containing compounds having carboxyl; nitrogen-containing compounds having sulfonyl; nitrogen-containing compounds having hydroxy; nitrogen-containing compounds having hydroxyphenyl; alcoholic nitrogen-containing compounds; amide derivatives; and imide derivatives.

Examples of a primary aliphatic amine include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylenepentamine. Examples of a secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N'-dimethylmethylenediamine, N,N'-dimethylethylenediamine and N,N''''-dimethyltetraethylenepentamine. Examples of a tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N'''', N''''-tetramethyltetraethylenepentamine.

Examples of a mixed amine include dimethylethylamine, methylethylpropylamine, benzylamine, phenetylamine and benzyldimethylamine. Examples of an aromatic or heterocyclic amine include anilines such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine; diphenyl(p-tolyl)amine; methyldiphenylamine; triphenylamine; phenylenediamine; naphthylamine; diaminonaphthalene; pyrroles such as pyrrole, 2H-pyrrole, 1-methylpyrrole, 2,4-dimethylpyrrole, 2,5-dimethylpyrrole and N-methylpyrrole; oxazoles such as oxazole and isoxazole; thiazoles such as thiazole and isothiazole; imidazoles such as imidazole, 4-methylimidazole and 4-methyl-2-phenylimidazole; pyrazoles; furazans; pyrrolines such as pyrroline and 2-methyl-1-pyrroline; pyrrolidines such as pyrrolidine, N-methylpyrrolidine, pyrrolidinone and N-methylpyrrolidone; imidazolines; imidazolidines; pyridines such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine and dimethylaminopyridine; pyridazines; pyrimidines; pyrazines; pyrazolines; pyrazolidines; piperidines; piperazines; morpholines; indoles; isoindoles; 1H-indazoles; indolines; quinolines such as quinoline and 3-quinolinecarbonitrile; isoquinolines; cinnolines; quinazolines; quinoxalines; phthalazines; purines; pteridines; carbazoles; phenanthridines; acridines; phenazine; 1,10-phenanthrolines; adenines; adenosines; guanines; guanosines; uracils; uridines, and so on.

Examples of a nitrogen-containing compound having a carboxyl group include aminobenzoic acids; indole carboxylic acids; amino acid derivatives such as nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxyalanine, and so on.

Examples of a nitrogen-containing compound having a sulfonyl group include 3-pyridinesulfonic acid, pyridinium p-toluenesulfonate, and so on.

Examples of a nitrogen-containing compound having a hydroxy group, a nitrogen-containing compound having a hydroxyphenyl group or an alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyyulolidine, 3-quinuclidinol, 3-tropanol, 1-methyl-2-pyrrolidineethanol, 1-aziridineethanol, N-(2-hydroxyethyl)phthalimide, N-(2-hydroxyethyl)isonicotinamide and so on.

Examples of an amide include formamide, N-methylformamide, N,N-dimethylformamide, acetamide, N-methylacetamide, N,N-dimethylacetamide, propionamide, benzamide and so on.

Examples of an imide include phthalimide, succinimide, maleimide and so on.

Other examples which can be used as a quencher include tris(2-methoxymethoxyethyl)amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris{2-[2-(2-hydroxyethoxy)ethoxy]ethyl}amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl) amine, tris(2-valeryloxyethyl)amine, tris(2-pivaloyloxyethyl)amine, N,N-bis(2-acetoxyethyl)2-(acetoxyacetoxy) ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)2-(methoxycarbonyl) ethylamine, N,N-bis(2-acetoxyethyl)2-(methoxycarbonyl) ethylamine, N,N-bis(2-hydroxyethyl)2-(ethoxycarbonyl) ethylamine, N,N-bis(2-acetoxyethyl)2-(ethoxycarbonyl) ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis (2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl) 2-[(methoxycarbonyl)methoxycarbonyl]ethylamine, N,N-bis(2-hydroxyethyl)2-(2-oxopropoxycarbonyl)ethylamine, N,N-bis (2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl] ethylamine, N,N-bis(2-acetoxyethyl)2-[(2-oxotetrahydrofuran-3-yl)oxycarbonyl]ethylamine, N,N-bis (2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl)amine, N-butylbis (methoxycarbonylmethyl)amine, N-hexylbis (methoxycarbonylmethyl)amine, β-(diethylamino)-δ-valerolactone and so on.

Quenchers may be used alone or in combination of two or more.

Their content is suitably 0 to 2 wt parts, particularly 0.01 to 1 wt part to 100 wt parts of the solid in a resist material. If it is more than 2 wt parts, sensitivity may be excessively lowered.

In this invention, a salt exhibiting buffer effect may be preferably a compound which can prevent fluctuation of a proton concentration in a resist to keep the concentration constant as if equilibrium is established in the resist. Particularly preferably, a resist composition comprises an anion of an acid generated from a photoacid generator or its substituted derivative, to effectively prevent fluctuation of a proton concentration in the resist. Thus, for example, fluctuation of a proton concentration can be prevented when an organic base such as an amine permeates into a resist composition.

An acid in a photoacid generator may be an acid having a less volatile anion or an anion which is not extremely diffusible. Examples of a suitable anion herein include benzenesulfonate anion, toluenesulfonate anion, xylenesulfonate anion, 4-chlorobenzenesulfonate anion, 4-(4-toluenesulfonyloxy)benzenesulfonate anion, pentafluorobenzenesulfonate anion, tert-butanesulfonate anion, 2,2,2-trifluoroethanesulfonate anion, nonafluorobutanesulfonate anion, heptadecafluorooctanesulfonate anion and camphorsulfonate anion. It may be preferably selected from, for example, the acids represented by general formulas (A) to (E).

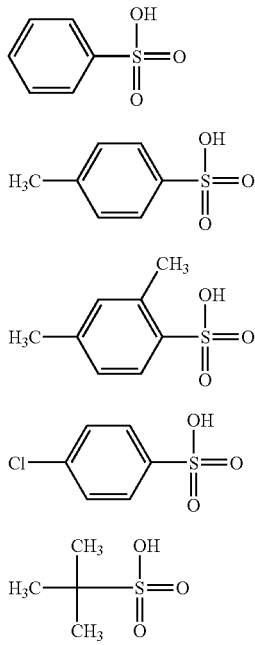

A salt exhibiting buffer effect may comprise any of the bases or their substituted derivatives which can be used as a quencher, to reliably improve resolution of a resist pattern. Such a base may be, for example, suitably an amine.

Examples of a base which can be used as a quencher include amines such as 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyyulolidine, 3-quinuclidinol, 3-tropanol, 1-methyl-2-pyrrolidineethanol, 1-aziridineethanol, tris(2-methoxymethoxyethyl)amine, tris(2-(2-methoxyethoxy)ethyl)amine, tris(2-(2-methoxyethoxymethoxy)ethyl)amine, tris(2-(1-methoxyethoxy)ethyl)amine, tris(2-(1-ethoxyethoxy)ethyl)amine, tris(2-(1-ethoxypropoxy)ethyl)amine, tris[2-(2-(2-hydroxyethoxy)ethoxy)ethyl]amine, tris(2-formyloxyethyl)amine, tris(2-acetoxyethylamine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl) ethylamine, N,N-bis(2-acetoxyethyl)2-(methoxycarbonyl) ethylamine, N,N-bis(2-hydroxyethyl)2-(ethoxycarbonyl) ethylamine, N,N-bis(2-acetoxyethyl)2-(ethoxycarbonyl) ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl] ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl)amine, N-butylbis (methoxycarbonylmethyl)amine, N-hexylbis (methoxycarbonylmethyl)amine and β-(diethylamino)-δ-valerolactone.

A preferable salt exhibiting buffer effect is a salt of sulfonic acid with alkanolamine or alkoxyalkylamine. Specific compounds may be those represented by formulas (F) to (H), which can be used to reliably improve sensitivity during forming a resist pattern.

 (F)

 (G)

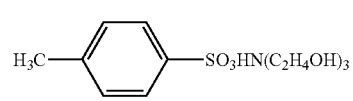 (H)

An acid constituting a salt exhibiting buffer effect is preferably a substance whose pKa (25° C.) is from 3 to 12 in acetonitrile. Such a substance can be added to a resist composition to achieve adequate buffer effect for reliable resist performance.

A content of a salt exhibiting buffer effect in a resist composition is not particularly limited as long as it is adequate to exert buffer effect, and for example, is not less than 0.001 wt parts, preferably not less than 0.01 wt parts to 100 wt parts of a solid in the resist composition. Thus, buffer effect can be ensured in the resist composition. The salt exhibiting buffer effect may be contained at up to 30 wt parts, preferably up to 10 wt parts to 100 wt parts of a solid in the resist composition. Thus, a desirable resist shape can be reliably formed.

When adding a salt exhibiting buffer effect to a resist composition, it may be added after being formed as a salt, or may be added as a mixed solution prepared by mixing an acid and a base in an organic solvent.

A resist composition of this invention may contain an organic solvent, which may be capable of dissolving a photoacid generator and a base resin. Examples of such an organic solvent include, but not limited to, ketones such as cyclohexanone and methyl-n-amylketone; alcohols such as 3-methoxybutanol, 3-methyl-3-methoxybutanol, 1-methoxy-2-propanol and 1-ethoxy-2-propanol; ethers such as propyleneglycolmonomethyl ether, ethyleneglycolmonomethyl ether, propyleneglycolmonoethyl ether, ethyleneglycolmonoethyl ether, propyleneglycoldimethyl ether and diethyleneglycoldimethyl ether; and esters such as propyleneglycolmonomethyl ether acetate, propyleneglycolmonoethyl ether acetate, ethyl lactate, ethyl pyruvate, butyl acetate, methyl 3-methoxypropionate, ethyl 3-ethoxypropionate, tert-butyl acetate, tert-butyl propionate and propyleneglycol-mono-tert-butyl ether acetate, which can be used alone or in combination of two or more. Among these, organic solvents preferably used in this invention are diethyleneglycoldimethyl ether, 1-ethoxy-2-propanol and ethyl lactate which exhibit the highest ability of dissolving an acid generator in a resist composition, and propyleneglycolmonomethyl ether acetate which is a safe solvent, as well as mixtures thereof.

When a resist composition of this invention is a negative type, it may comprise a crosslinking agent, which may be a compound having two or more intramolecular hydroxymethyl, alkoxymethyl, epoxy or vinyl ether groups.

Suitable examples may include substituted glycolurils, ureas and hexa(methoxymethyl)melamine. Specific examples include N,N,N',N'-tetramethoxymethylurea, hexamethylmelamine; tetrahydroxymethylglycoluril; tetraalkoxymethyl-substituted glycolurils such as tetramethoxymethylglycoluril; and condensation products of a phenol compound (e.g., bis(hydroxymethylphenol)s and bisphenol-A) with epichlorohydrin. Particularly suitable crosslinking agents include 1,3,4,6-tetrahydroxymethylglycoluril, 1,3,4,6-tetraalkoxymethylglycolurils such as 1,3,4,6-tetramethoxymethylglycoluril, 2,6-dihydroxymethyl-p-cresol, 2,6-dihydroxymethylphenol, 2,2',6,6'-tetrahydroxymethylbisphenol-A, 1,4-bis[2-(2-hydroxypropyl)phenyl]benzene, N,N,N',N'-tetramethoxymethylurea and hexamethoxymethylmelamine.

A crosslinking agent may preferably initiate crosslinking by an acid. Its content may be appropriately determined, and is generally 1 to 25 wt parts, preferably 5 to 20 wt parts to 100 parts of the total solid in a resist composition. They may be used alone or in combination of two or more.

When a resist composition of this invention is a positive type, it may comprise a dissolution inhibitor. A dissolution inhibitor may be a compound having a molecular weight of up to $3 \times 10^3$ whose solubility in an alkali developing solution varies by the action of an acid; particularly, a phenol or carboxylic acid derivative having a lower molecular weight of up to $2.5 \times 10^3$, whose functional groups are partly or entirely substituted with an acid-labile substituent.

Examples of a phenol or carboxylic acid derivative having a molecular weight of up to $2.5 \times 10^3$ includes bisphenol-A, bisphenol-F, bisphenol-S, 4,4-bis(4-hydroxyphenyl)valeric acid, tris(4-hydroxyphenyl)methane, 1,1,1-tris(4-hydroxyphenyl)ethane, 1,1,2-tris(4-hydroxyphenyl)ethane, phenolphthalein and thymolphthalein. An acid-labile substituent may be selected from dissolution-inhibiting groups for a base resin.

Examples of a suitable dissolution inhibitor include bis[4-(2-tetrahydropyranyloxy)phenyl]methane, bis[4-(2-tetrahydrofuranyloxy)phenyl]methane, bis[4-tert-butoxyphenyl]methane, bis(4-tert-butoxycarbonyloxyphenyl)methane, bis(4-tert-butoxycarbonylmethyloxyphenyl)methane, bis[4-(1-ethoxyethoxy)phenyl]methane, bis[4-(1-ethoxypropyloxy)phenyl]methane, 2,2-bis[4-(2-tetrahydropyranyloxy)phenyl]propane, 2,2-bis[4-(2-tetrahydrofuranyloxy)phenyl]propane, 2,2-bis(4-tert-butoxyphenyl)propane, 2,2-bis(4-tert-butoxycarbonyloxyphenyl)propane, 2,2-bis(4-tert-butoxycarbonylmethyloxyphenyl)propane, 2,2-bis[4-(1-ethoxyethoxy)phenyl]propane, 2,2-bis[4-(1-ethoxypropyloxy)phenyl]propane, tert-butyl 4,4-bis[4-(2-tetrahydropyranyloxy)phenyl]valerate, tert-butyl 4,4-bis[4-(2-tetrahydrofuranyloxy)phenyl]valerate, tert-butyl 4,4-bis(4-tert-butoxyphenyl)valerate, tert-butyl 4,4-bis(4-tert-butoxycarbonyloxyphenyl)valerate, tert-butyl 4,4-bis(4-tert-butoxycarbonylmethyloxyphenyl)valerate, tert-butyl 4,4-bis[4-(1-ethoxyethoxy)phenyl]valerate, tert-butyl 4,4-bis[4-(1-ethoxypropyloxy)phenyl]valerate, tris[4-(2-tetrahydropyranyloxy)phenyl]methane, tris[4-(2-tetrahydrofuranyloxy)phenyl]methane, tris(4-tert-butoxyphenyl)methane, tris(4-tert-butoxycarbonyloxyphenyl)methane, tris(4-tert-butoxycarbonyloxymethylphenyl)methane, tris[4-(1-ethoxyethoxy)phenyl]methane, tris[4-(1-ethoxypropyloxy)phenyl]methane, 1,1,2-tris[4-(2-tetrahydropyranyloxy)phenyl]ethane, 1,1,2-tris[4-(2-tetrahydrofuranyloxy)phenyl]ethane, 1,1,2-tris(4-tert-butoxyphenyl)ethane, 1,1,2-tris(4-tert-butoxycarbonyloxyphenyl)ethane, 1,1,2-tris(4-tert-butoxycarbonylmethyloxyphenyl)ethane, 1,1,2-tris[4-(1-ethoxyethoxy)phenyl]ethane and 1,1,2-tris[4-(1-ethoxypropyloxy)phenyl]ethane.

A content of a dissolution inhibitor in a resist composition used for a chemically amplified resist is preferably up to 20 wt parts, more preferably up to 15 wt parts to 100 wt parts of a solid in the resist material. If it is more than 20 wt parts, increased monomer components may cause deterioration in heat resistance of the resist material.

There will be described a semiconductor process using a resist composition according to this invention with reference to the drawings. In the following embodiments, the resist compositions described above are used.

Embodiment 1

This embodiment illustrates a dual damascene process employing a via-first method, using a chemically amplified resist composition. FIG. 1 is cross-sectional views showing a manufacturing process for a semiconductor device according to this embodiment.

First, on a lower interconnection layer 108 are sequentially deposited a first etching stopper film 107, a first interlayer insulating film 106, a second etching stopper film 105, a second interlayer insulating film 104 and a third interlayer insulating film 103. Then, using well-known lithography and etching technique, a via-hole 111 is formed in the third interlayer insulating film 103, the second interlayer insulating film 104, the second etching stopper film 105 and the first interlayer insulating film 106 (FIG. 1(*a*)).

Then, an anti-reflection film 102 is formed on the third interlayer insulating film 103 and the first etching stopper film 107, during which the via-hole 111 is partly or totally buried with the anti-reflection film 102. This figure shows that the via-hole 111 is partly buried with the anti-reflection film 102 (FIG. 1(b)).

Next, on the anti-reflection film 102 is applied a chemically amplified resist 101 (FIG. 1(c)). Then, in the chemically amplified resist 101 is formed an opening pattern 112 for forming an interconnection trench connected to the via-hole 111 (FIG. 1(d)). Herein, the resist composition described above is used for forming the chemically amplified resist 101. Such a resist composition can be used as a chemically amplified resist 101 to provide a resist pattern exhibiting improved sensitivity and resolution when forming an opening pattern 112.

Subsequently, using the chemically amplified resist 101 as a mask, the anti-reflection film 102 on the third interlayer insulating film 103, and then the third interlayer insulating film 103 and the second interlayer insulating film 104 are etched off to form an interconnection trench 113 (FIGS. 1(e) and (f)).

Then, the chemically amplified resist 101 and the anti-reflection film 102 are stripped off by $O_2$ plasma ashing and using an amine stripper. Next, the first etching stopper film 107 at the bottom of the via-hole 111 is etched off to provide a structure where the via-hole 111 is connected to the upper surface of the interconnection metal (not shown) in the lower interconnection layer 108 (FIG. 1(g)).

Next, a metal film is formed so that it buries the interconnection trench 113 and the via-hole 111. The metal film can be formed by first forming a barrier metal film within the interconnection trench 113 and the via-hole 111 by sputtering and then burying the interconnection trench 113 and the via-hole 111 with an interconnection metal film by, for example, electroplating. Subsequently, unwanted barrier metal and interconnection metal films outside the interconnection trench 113 are removed by CMP to form an interconnection 109 (FIG. 1(h)). Thus, a semiconductor device having a desired pattern can be reliably provided.

A light source used in lithography of a chemically amplified resist 101 may be selected from, for example, KrF excimer laser, ArF excimer laser, $F_2$ excimer laser, EUV and EB.

The third interlayer insulating film 103 may be, for example, an $SiO_2$, SiOC, SiC or SiCN film. The second interlayer insulating film 104 and the first interlayer insulating film 106 may be a low dielectric-constant film made of a material with a lower dielectric constant such as $SiO_2$, HSQ, MSQ, MHSQ, ladder-type hydrogenated siloxane, SiLK®, SiOF, SiOC, SiON and BCB (benzocyclobutene) films. When the first interlayer insulating film 106 is a low dielectric-constant film, the film has a lower density than an $SiO_2$ film and thus tends to occlude an organic base such as an amine, but allows the chemically amplified resist 101 to be much more effective, suitably ensuring sensitivity and resolution of the resist pattern.

A ladder-type hydrogenated siloxane is a polymer having a ladder-like molecular structure, which preferably has a dielectric constant of 2.9 or less in the light of preventing interconnection delay. For example, preferably, the density of a lower film is from 1.50 g/cm² to 1.58 g/cm² and its refractive index (at 633 nm) is from 1.38 to 1.40. A specific example of such a film material is L-Ox™ which is called a ladder oxide (hereinafter, referred to as "L-Ox"). An insulating material prepared by making an L-Ox porous can be also used.

The second etching stopper film 105 and the first etching stopper film 107 may be, for example, an SiC, SiN, SiON or SiCN film. When the second etching stopper film 105 or the first etching stopper film 107 is a nitrogen-containing film, a basic component such as an amine tends to permeate into the second interlayer insulating film 104 or the first interlayer insulating film 106. However, when using such a film, a chemically amplified resist 101 can be employed to allow a salt in the chemically amplified resist 101 to be more effective. The chemically amplified resist 101 can be more suitably used in a process for forming a resist pattern on an insulating film comprising a concave to be an interconnection trench or a via-hole.

As described above, according to this embodiment, a chemically amplified resist 101 can be used to prevent poisoning of a resist and to improve sensitivity in lithography.

Embodiment 2

Figure 2:
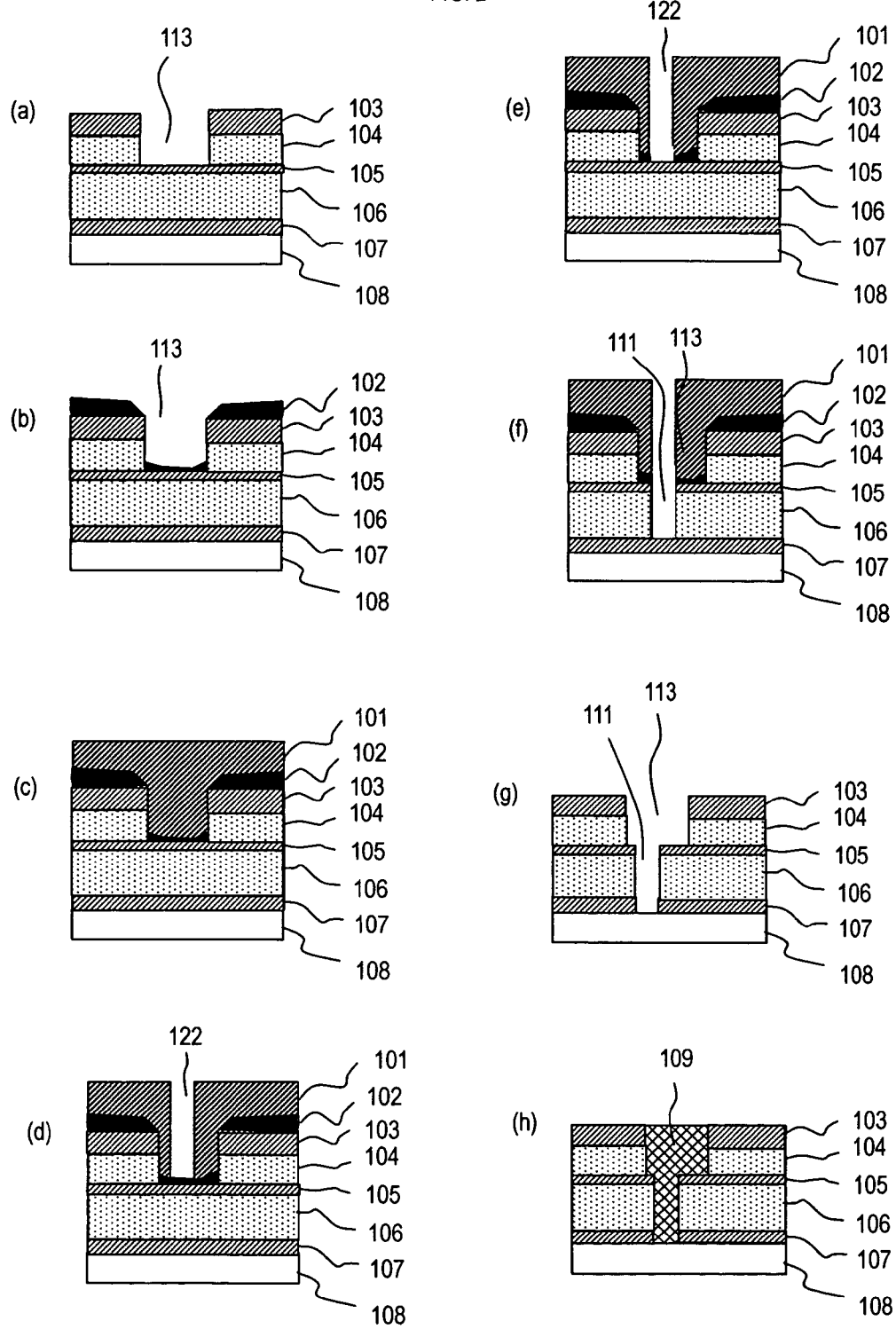
FIG. 2 is a cross-sectional view showing a process for manufacturing a semiconductor device according to an embodiment.

The interconnection structure in FIG. 1(h) may be also manufactured by a so-called trench-first method among dual damascene processes. There will be described a copper interconnection structure manufactured by a trench-first method with reference to FIG. 2. In this embodiment, similar components to those in Embodiment 1 are identified with the same symbols without any description as appropriate.

As described in Embodiment 1, on a lower interconnection layer 108 are sequentially deposited a first etching stopper film 107, a first interlayer insulating film 106, a second etching stopper film 105, a second interlayer insulating film 104 and a third interlayer insulating film 103. Then, using well-known lithography and etching technique, an interconnection trench 113 is formed in the third interlayer insulating film 103 and the second interlayer insulating film 104 (FIG. 2(a)).

Then, an anti-reflection film 102 is formed on the third interlayer insulating film 103 and the second etching stopper film 105, during which the interconnection trench 113 is partly or totally buried with the anti-reflection film 102. This Figure shows that the interconnection trench 113 is partly buried with the anti-reflection film 102 (FIG. 2(b)).

Next, on the anti-reflection film 102 is applied a chemically amplified resist 101 (FIG. 2(c)). Herein, the resist composition described in Embodiment 1 is used as the chemically amplified resist 101. Then, in the chemically amplified resist 101 is formed an opening pattern 122 for forming a via-hole connected between the interconnection trench 113 and a lower interconnection layer 108 (FIG. 2(d)).

Subsequently, using the chemically amplified resist 101 as a mask, the anti-reflection film 102 on the second etching stopper film 105, and then the second etching stopper film 105 and the first interlayer insulating film 106 are etched off to form a via-hole 111 (FIGS. 2(e) and (f)).

Then, the chemically amplified resist 101 and the anti-reflection film 102 are stripped off by $O_2$ plasma ashing and using an organic stripper. Next, the first etching stopper film 107 at the bottom of the via-hole 111 is etched off to provide a structure where the. via-hole 111 is connected to the upper surface of the interconnection metal (not shown) in the lower interconnection layer 108 (FIG. 2(g)). FIG. 2(g) shows the same structure as that in FIG. 1(g), so that an interconnection 109 can be formed as described in Embodiment 1 in subsequent processes (FIG. 2(h)).

As described above, in a trench-first process, a chemically amplified resist 101 can be also used to prevent poisoning of a resist and to improve sensitivity in lithography.

Embodiment 3

Figure 3:
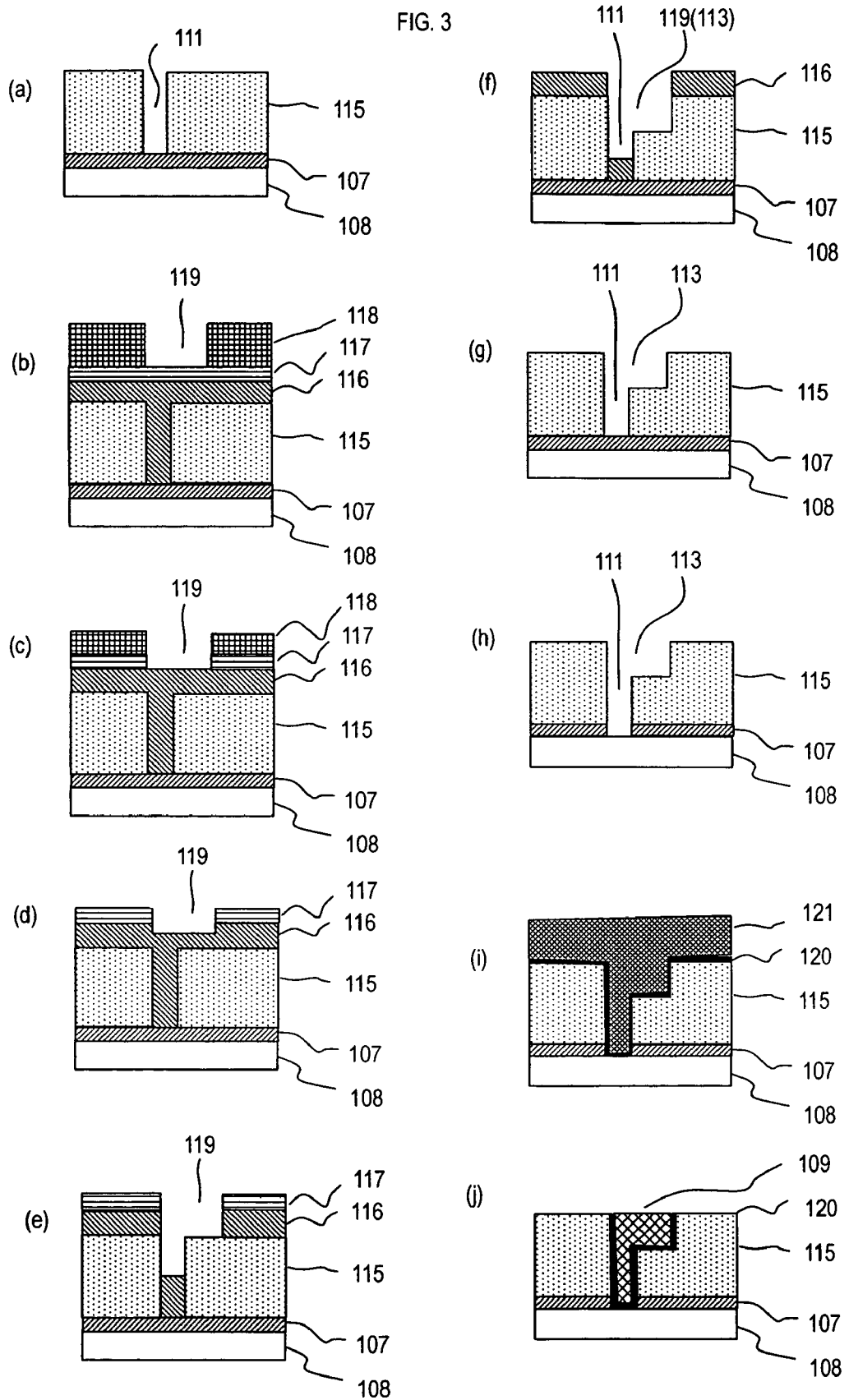
FIG. 3 is a cross-sectional view showing a process for manufacturing a semiconductor device according to an embodiment.

The resist composition used in Embodiment 1 or 2 can be applied to a via-first dual damascene process using a three-layer resist method. There will be described this process with reference to FIG. 3.

First, on a lower interconnection layer 108 are sequentially deposited a first etching stopper film 107 and an interlayer insulating film 115. Then, using well-known lithography and etching technique, a via-hole 111 is formed in the interlayer insulating film 115 (FIG. 3(a)).

Then, an anti-reflection film (not shown) is formed on the interlayer insulating film 115 and the first etching stopper film 107, during which the via-hole 111 is partly or totally buried with the anti-reflection film. Then, on the anti-reflection film is applied a three-layer resist film consisting of a first resist film 116, a second resist film 117 and a third resist film 118, in which the first resist film 116 comprises the resist composition described above. Then, in the third resist film 118 is formed an opening pattern 119 for forming an interconnection trench connected to the via-hole 111 (FIG. 3(b)).

Subsequently, using the third resist film 118 as a mask, the second resist film 117 is etched off (FIG. 3(c)).

Then, the third resist film 118 is stripped off by $O_2$ plasma ashing and using an organic stripper, during which the upper part of the first resist film 116 is partly removed (FIG. 3(d)). Next, using the second resist film 117 as a mask, the first resist film 116 on the interlayer insulating film 115 and the interlayer insulating film 115 are sequentially etched off to form an opening pattern 119 (FIGS. 3(e) and (f)). Then, the first resist film 116 and the anti-reflection film (not shown) are stripped off by $O_2$ plasma ashing and using an organic stripper (FIG. 3(g)). Then, the first etching stopper film 107 at the bottom of the via-hole 111 is etched off to provide a structure where the via-hole 111 is connected to the upper surface of the interconnection metal (not shown) in the lower interconnection layer 108 (FIG. 3(h)).

Next, a metal film is formed such that it buries the opening pattern 119 (that is, the interconnection trench 113) and the via-hole 111. The metal film can be formed by first forming a barrier metal film 120 within the interconnection trench 113 and the via-hole 111 by sputtering and then burying the interconnection trench 113 and the via-hole 111 with an interconnection metal film 121 by, for example, electroplating (FIG. 3(i)). Subsequently, the unwanted barrier metal film 120 and the interconnection metal film 121 outside the interconnection trench 113 are removed by CMP to form an interconnection 109 (FIG. 3(j)).

In this embodiment, the first resist film 116 comprises a salt exhibiting buffer effect, so that a highly sensitive patterning can be achieved for the first resist film 116 even after patterning the second resist film 117 and the third resist film 118.

This invention has been described with reference to some embodiments. The person skilled in the art will easily appreciate that these embodiments are only illustrative and there may be a variety of modifications, all of which are encompassed by this invention.

Although a resist composition has been described in terms of a process used in a dual damascene process, it may be applied to another semiconductor process or other processes such as a manufacturing process for a reticule. In such a case, on a chromium film may be, for example, patterned a chemically amplified resist, which may be used as a mask for forming an opening with a desired shape.

The resist composition in this embodiment can increase an exposure margin without adding a quencher. It can be, therefore, applied to not only lithography using a chemically amplified resist, but also another type of resist such as a resist for EB (electron beam) exposure. In the latter resist, a pattern with improved sensitivity and resolution can be also attained.

EXAMPLES

Example 1

In this example, there was studied the action of a quencher in a resist composition. As a model for a resist composition, a solution of a given amount of a quencher in a non-aqueous solvent was used and pH shift was determined by titration when adding an acid generated from a photo-acid generator.

Specifically, acetonitrile and triethanolamine were used as a non-aqueous solvent and a quencher, respectively. To a given amount of triethanolamine in acetonitrile solution (100 mL) was added dropwise 0.1M p-toluenesulfonic acid solution in acetonitrile by 0.05 mL, using an automatic titrator (Hiranuma Autotitrator COM-980Win; HIRANUMA SANGYO Co. Ltd.). Table 1 shows the compositions of the samples titrated. In this table, 1 mM monoethanolamine was added to Sample Nos. 2, 4, 6 and 8, as a model for a system comprising a quencher in acetonitrile in a resist composition, into which an amine permeated.

Figure 4:
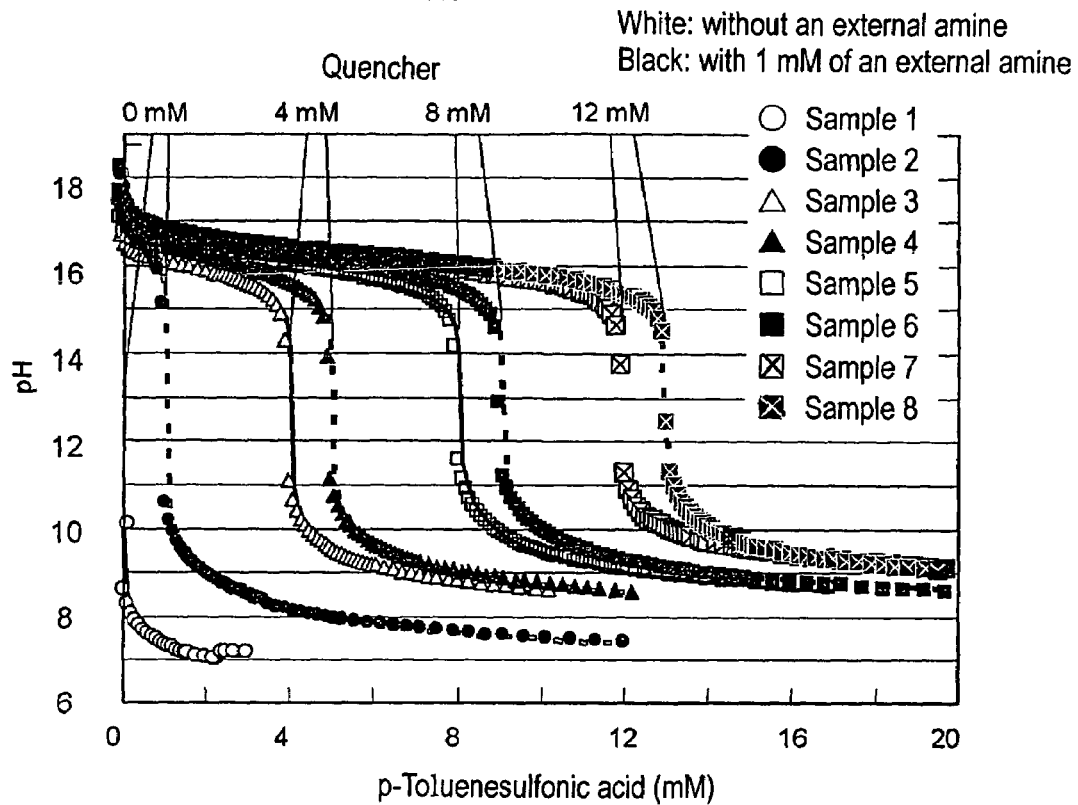
FIG. 4 shows a titration curve in an example.
Figure 5:
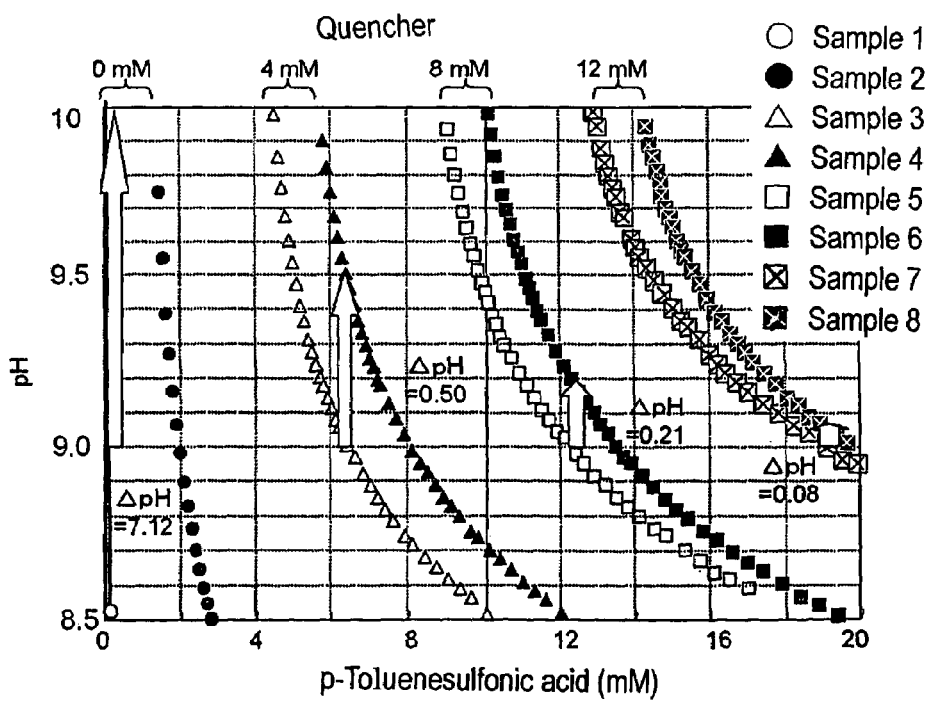
FIG. 5 is a partial enlarged view of FIG. 4.

Table 1 also shows a point of neutralization determined for each sample. Titration curves for the individual samples are shown in FIGS. 4 and 5. FIG. 5 is an enlarged view of a pH range of 8.5 to 10 in the titration curves for the samples.

TABLE 1

| Sample number | Quencher Model compound | mM | External amine Model compound | mM | Point of neutralization mM |
|---|---|---|---|---|---|
| 1 | $N(C_2H_4OH)_3$ | 0.0 | $NH_2C_2H_4OH$ | 0.0 | 0.0 |
| 2 | $N(C_2H_4OH)_3$ | 0.0 | $NH_2C_2H_4OH$ | 1.0 | 1.0 |
| 3 | $N(C_2H_4OH)_3$ | 4.0 | $NH_2C_2H_4OH$ | 0.0 | 4.0 |
| 4 | $N(C_2H_4OH)_3$ | 4.0 | $NH_2C_2H_4OH$ | 1.0 | 5.0 |
| 5 | $N(C_2H_4OH)_3$ | 8.0 | $NH_2C_2H_4OH$ | 0.0 | 8.0 |
| 6 | $N(C_2H_4OH)_3$ | 8.0 | $NH_2C_2H_4OH$ | 1.0 | 9.1 |
| 7 | $N(C_2H_4OH)_3$ | 12.0 | $NH_2C_2H_4OH$ | 0.0 | 12.0 |
| 8 | $N(C_2H_4OH)_3$ | 12.0 | $NH_2C_2H_4OH$ | 1.0 | 13.1 |

These results indicate the followings.

The quencher mechanism in the prior art has proposed that a quencher causes deprotonation represented by formula (1), resulting in buffer effect.

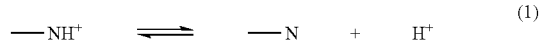

$$—NH^+ \rightleftharpoons —N + H^+ \qquad (1)$$

However, the equilibrium reaction in formula (1) does not easily move toward the right side. The pKa of conjugated acid of amines is usually much higher than the pKa of acids. For example, the pKa of conjugated acid of triethanolamine is 15.9, while the pKa of p-toluenesulfonic acid is 8.7 in acetonitrile at 25° C. (Kimisuke Izutsu, "Hisuiyoueki no Denkikagaku (Electrochemistry in Nonaqueous solutions)", edited by Baihukan, 1995, p.48 and 53). Therefore, in formula (1) under acidic conditions where a photoacid generator exists, it can be assumed that dissociation of a proton attached to an amine may be almost negligible.

Categorizing the results in Table 1 and FIG. 4 in accordance with relationship between a quencher concentration in a sample ($C_b$) and a concentration of an acid added into the sample ($C_a$), the following (i) to (iii) have been found.

(i) $C_b > C_a$

When a quencher concentration in a sample ($C_b$) is larger than an acid added into the sample ($C_a$), i.e., in an initial range in the titration curve, the quencher base is neutralized by the acid added as demonstrated by equation (2):

$$R_3N\ HA \rightarrow R_3NHA \qquad (2)$$

wherein R represents $C_2H_4OH$ in triethanolamine; and A represents $CH_3C_6H_4SO_3^-$ group in p-toluenesulfonic acid.

(ii) $C_b = C_a$

A neutralization point in each titration curve shown in FIG. 4 corresponds to, as shown in Table 1, the total base concentration, i.e., the sum of a quencher concentration and an external amine concentration. In samples 1, 3, 5 and 7 without an external amine, an acid at the same concentration as an initial concentration of the quencher $C_b$ is used for neutralization.

In a practical resist composition, as a neutralization point is higher, a concentration of the acid used in the reaction of formula (2) is increased, resulting in reduction of a concentration ratio of an acid generated from a photoacid generator which can act on a photosensitive polymer. When this neutralization point is fluctuated due to the presence of an external amine, a concentration of the acid which can act on a photosensitive polymer varies, so that a wide exposure margin cannot be set, which is undesirable in the light of reliably conducting lithography.

(iii) $C_a > C_b$

FIG. 4 demonstrates that in a sample without an external amine, as a concentration of an acid added ($C_a$) increases, a pH rapidly reduces and after a neutralization point, a proton concentration [$H^+$] significantly increases. In this range, an equilibrium expressed by equation (3) is effective, where the acid is dissociated and then moved to a matrix M for protons. In this equation, the matrix M is acetonitrile.

$$HA + M \rightarrow MH^+ + A^- \qquad (3)$$

An equilibrium constant Kc in equation (3) can be expressed as equation (4) using an activity "a", and under approximation that the "a" is equal to a molar concentration, the equation constant Kc can be expressed by equation (5):

$$Kc = \frac{a(H^+)a(A^-)}{a(HA)a(M)} \qquad (4)$$

$$Kc = \frac{[H^+][A^-]}{[HA][M]} \qquad (5)$$

Assuming that [$MH^+$]<<[M] and [M] is a constant in equation (5), equation (6) can be derived, where an acid dissociation constant $K_a$ is equal to a constant Kc[M].

$$Ka = Kc[M] = \frac{[H^+][A^-]}{[HA]} \qquad (6)$$

When a dissociation equation of an acid is expressed by equation (7), an acid dissociation constant Ka can be expressed by equation (8). As described above, the pKa (=–log Ka) of p-toluenesulfonic acid in acetonitrile at 25° C. is 8.7 (Ka≅2.0×10⁻⁹), the equilibrium reaction in equation (3) is substantially shifted to the left.

$$HA \rightleftharpoons H^+ + A^- \qquad (7)$$

$$Ka = \frac{[H^+][A^-]}{[HA]} \qquad (8)$$

Furthermore, a neutralization reaction of a quencher with an acid causes an equilibrium expressed by equation (9), resulting in increase of a dissociated anion concentration [$A^-$]. Thus, the acid dissociation equilibrium of equation (3) is further shifted to the left.

$$R_3NHA \rightleftharpoons (R_3NH^+, A^-)_{solv} \rightleftharpoons R_3NH^+_{solv} + A^-_{solv} \qquad (9)$$

FIG. 4 demonstrates that the higher a concentration of the quencher initially added, the more a salt is generated in the system. A higher pH in the range of $C_a > C_b$, therefore, confirms the above description.

These (i) to (iii) suggest that a system comprising a quencher behaves as an equilibrium system in an aqueous solution. The range in (iii) corresponds to the fact that an acidic buffer solution contains a weak acid or conjugate base to a weak acid. Thus, there will be discussed a mechanism for action of a quencher as a buffer when a sample is contaminated with a basic component.

In this example, a basic component used was monoethanolamine. Samples 2, 4, 6 and 8 comprise 1 mM monoethanolamine as an external amine and an equivalent concentration of a quencher, corresponding to samples 1, 3, 5 and 7 without monoethanolamine, respectively. FIG. 5 is a partial enlarged view of FIG. 4 for more clearly demonstrating difference in an acidic range in a titration curve, depending on presence or absence of an external amine.

When an external amine $NRH_2$ is added to a buffer system, a reaction expressed by equation (10) is initiated. A large amount of the undissociated acid HA is present in the buffer system, which is bound to the external amine to prevent pH shift.

$$RNH_2 + HA \rightarrow RNH_3^+ + A^- \qquad (10)$$

It is assumed that in a sample comprising the external amine in FIG. 5, a neutralization point ($C_b = C_a$), i. e., a proton concentration [$H^+$] required for an effective acid to be present in a photopolymer in a practical system, is a point of pH=9. It can be thus found that the higher a quencher concentration is, the less a pH shift, ΔpH, in FIG. 5 is. It is, therefore, confirmed that significant buffering action is effective in the model of this invention comprising a quencher.

Next, effect in a system comprising a quencher will be simulated using an equation for an acid dissociation constant. In the range of $C_a > C_b$ for acid dissociation equilibrium expressed by equation (7), there is a relationship expressed by equations (11) to (13), assuming that a concentration of an ionized acid is x moles.

$$[HA] = C_a - C_b - x \qquad (11)$$

$$[H^+] = x \qquad (12)$$

$$[A^-] = C_b + x \qquad (13)$$

From the above relationship, the salt formed by neutralization of the quencher with the acid, $R_3NHA$ (equation (2)) can be assumed to be completely dissociated in the system. Under this assumption, $A^-$ derived from the salt is equal to the quencher concentration $C_b$ and the total of $A^-$ present in the system is the sum of $C_b$ and x, wherein x is a concentration of dissociated A⁻ in equation (7).

In this assumption, contribution of self-ionization of the matrix M or a reaction of the matrix M with the anion A⁻ is probably negligible, so that these factors are neglected. p-Toluenesulfonic acid is homoconjugated to some extent in acetonitrile, but for simplifying the model herein, a homoconjugation reaction between the anion A⁻ and HA expressed by equation (14) is also neglected.

(14)

Assuming that x is so small to allow approximation of $C_a-C_b-x \cong C_a-C_b$ and $C_b-x \cong C_b$, equation (8) for an acid dissociation constant can be expressed as equation (15). Therefore, under simplification that an activity of hydrogen ion is equal to its molar concentration, a pH is expressed by equation (16) from equation (15).

$$[H^+] = Ka \frac{C_a - C_b}{C_b} \quad (15)$$

$$\begin{aligned} pH &= -\log[H^+] \quad (16) \\ &= -\log Ka - \log \frac{C_a - C_b}{C_b} \\ &= pKa - \log \frac{C_a - C_b}{C_b} \end{aligned}$$

When a concentration of an external amine in the system is $C_e$, fluctuation of a hydrogen-ion concentration and a pH' are studied as described above, obtaining equations (17) and (18).

$$[H^+]' = Ka \frac{C_a - C_b - C_e}{C_b + C_e} \quad (17)$$

$$\begin{aligned} pH' &= -\log[H^+]' \quad (18) \\ &= pKa - \log \frac{C_a - C_b - C_e}{C_b + C_e} \end{aligned}$$

Thus, subtracting equation (16) from equation (18), equation (19) for a pH shift, ΔpH, due to incorporation of an external amine is obtained.

$$\begin{aligned} \Delta pH &= pH' - pH \quad (19) \\ &= \log\left(1 + \frac{C_a C_e}{C_b(C_a - C_b - C_e)}\right) \end{aligned}$$

As described above, equation (19) holds only when the total of the acid is smaller than the sum of the quencher and the external amine, i. e., when $C_a-C_b-C_e>0$. Under these conditions, equation (19) clearly demonstrates that as a quencher concentration increases, pH shift is reduced.

Figure 6:
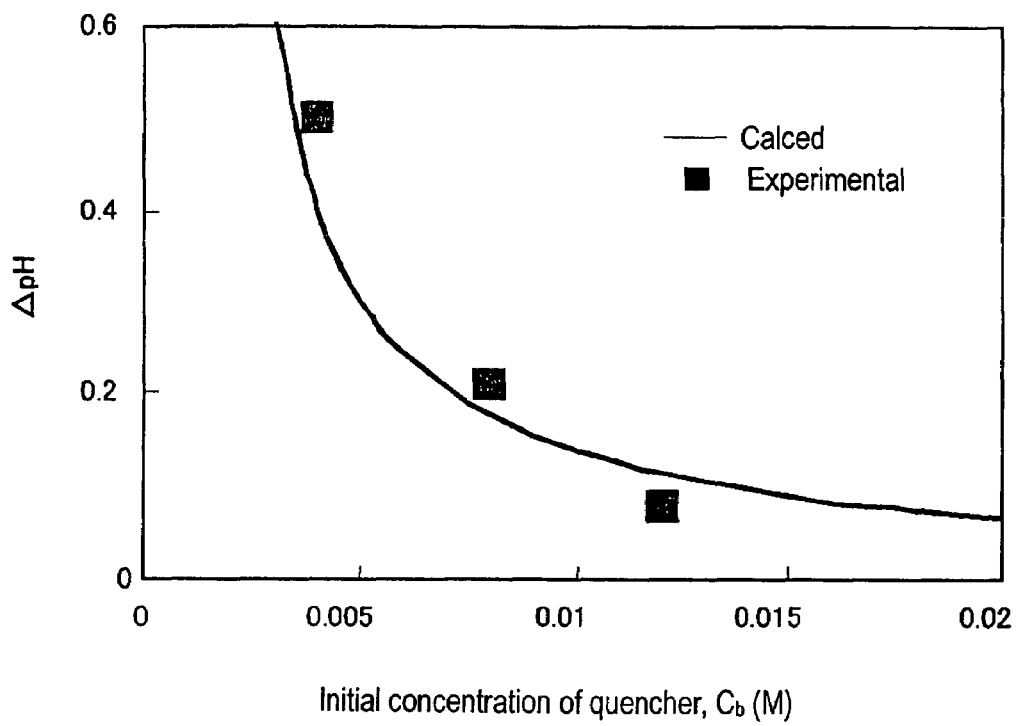
FIG. 6 shows calculated and experimental values of $\Delta pH$ for examples.

FIG. 6 shows a calculated ΔpH at pH=9 and ΔpH obtained from FIG. 5. When determining a calculated value in FIG. 6, $C_a=1.5 \times C_b$ because a pKa of p-toluenesulfonic acid is 8.7. FIG. 6 demonstrates that the experimental values are in excellent agreement with the calculated values. It may confirm that equation (19) is valid as an approximation.

From the above investigation, the followings have been found. Generally, in a resist composition, an acid derived from a photoacid generator used is a substance corresponding to a strong acid in an aqueous solution. It has been, however, found that in acetonitrile, an organic solvent, such an acid exhibits a smaller dissociation ratio and when adding a salt having buffer effect to acetonitrile, equilibrium is established. Acetonitrile is an aprotic and non-aqueous solvent with a higher dielectric constant, so that it behaves as if such equilibrium is established in a practical resist composition.

Example 2

In this example, a solution of predetermined amounts of a quencher and of a salt in a non-aqueous solvent was used as a resist composition model, and pH shift after adding an acid generated from a photoacid generator was determined by titration.

Specifically, to samples 3 and 4 in Table 1 in Example 1 containing a quencher at 4 mM was further added triethanolamine p-toluenesulfonate (formula (H)) to 12 mM, and the resulting samples were subjected to pH titration as described in Example 1. The titration curves obtained were compared with those for samples 3 and 4, respectively.

Figure 7:
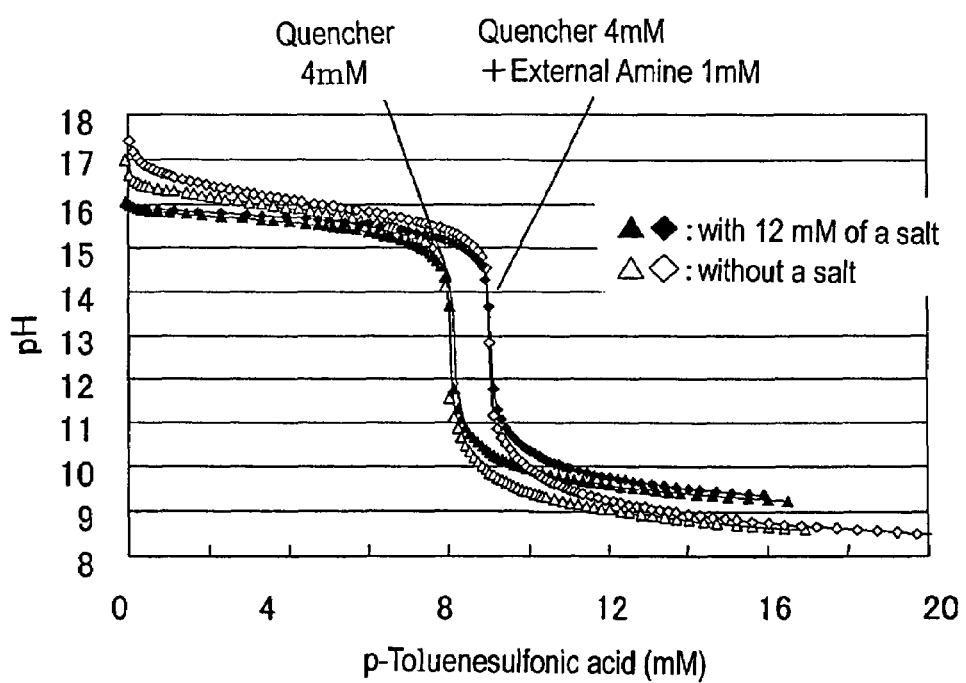
FIG. 7 shows a titration curve for an example.
Figure 8:
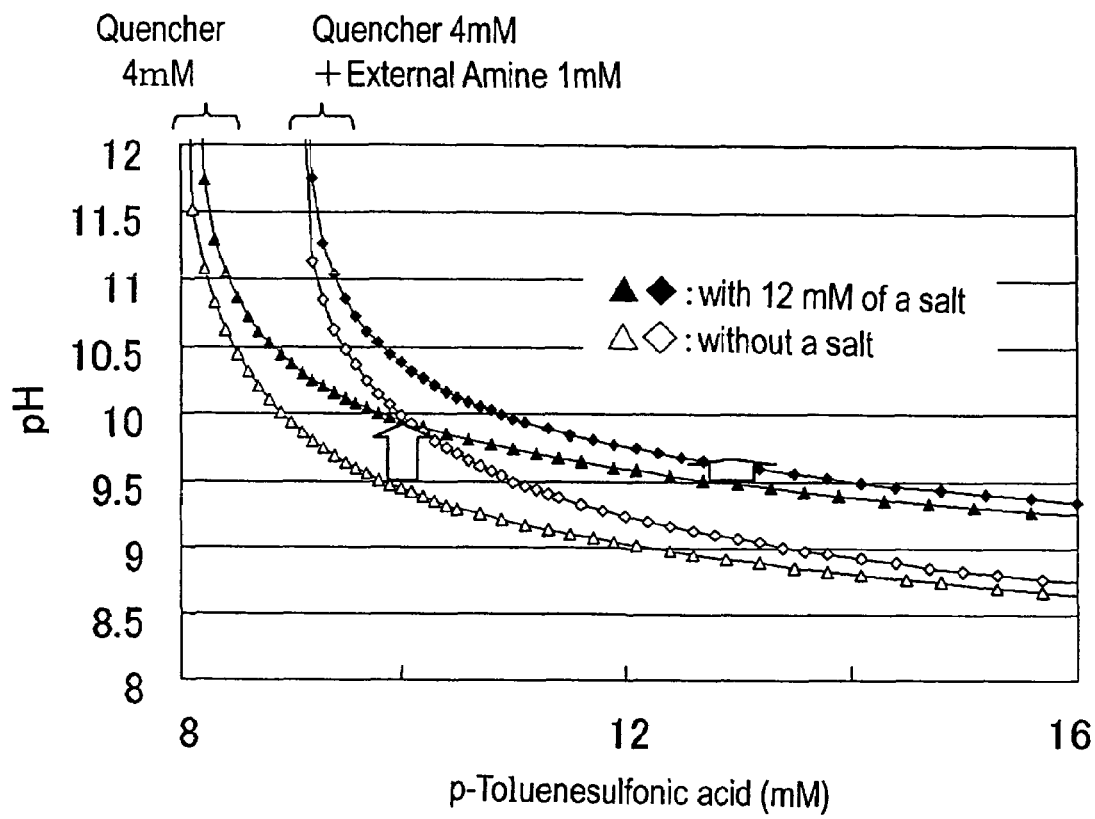
FIG. 8 is a partial enlarged view of FIG. 7.

FIGS. 7 and 8 are titration curves for these samples. FIG. 8 is an enlarged view of the pH=8 to 12 region in the titration curves in FIG. 7. FIG. 7 demonstrates that comparing presence of the salt for the samples containing a quencher at 4 mM, addition of the salt reduces fluctuation before and after the neutralization point. It may be thus expected that in a practical resist composition, fluctuation in a system pH can be also minimized by addition of a salt, resulting in reduced fluctuation of lithography sensitivity and reliable patterning.

Furthermore, FIG. 7 demonstrates that by adding a salt, a pH curve becomes flat in the above regions (i) and (iii), i. e., he region where a quencher (base) or acid is excessive. It indicates that pH shift associated with variation in the amount of the acid in the system is prevented. It may be, therefore, expected that in a practical resist composition, fluctuation in solubility of a base polymer associated with variation in the generated acid is prevented. Thus, even when an exposure varies in patterning a resist, a pattern can be reliably formed, that is, a wider exposure margin can be attained by adding a salt.

Furthermore, FIG. 8 demonstrates that contamination with an external amine causes a relatively larger pH shift in a system without a salt, while a pH shift is reduced even when being contaminated with an external amine in a system comprising a salt. It suggests that fluctuation of neutralization due to contamination of a system with an amine is prevented because a salt added significantly exhibits buffer effect. It may be, therefore, expected that in a practical resist composition, an acid generated from a photoacid generator by exposure can minimize reduction in an amount of an effective acid due to consumption of the acid in neutralization of the external amine, allowing patterning with higher sensitivity.

Example 3

In this example, an interconnection structure was manufactured on a silicon substrate, using a dual damascene process by a via-first method described with reference to FIG. 1. Herein, a lower interconnection layer 108 was an SiO₂ film with a thickness of 300 nm without an interconnection structure. A first etching stopper film 107 was an SiCN film with a thickness of 70 nm; a first interlayer insulating film 106 was an SiO₂ film with a thickness of 600 nm; a second etching stopper film 105 was an SiC film with a thickness of 50 nm; a second interlayer insulating film 104 was an L-Ox film with a thickness of 300 nm; a third interlayer insulating film 103 was an $SiO_2$ film with a thickness of 250 nm; and an anti-reflection film 102 was an anti-reflection film (Clariant Japan, KK.) with a thickness of 60 nm. The chemically amplified resist 101 had a thickness of 600 nm. The via-hole 111 (diameter ca 200 nm) was formed by the well-known lithography and etching technique and then the resist for via-hole forming was removed by $O_2$ plasma ashing and an amine stripper.

The chemically amplified resist 101 comprised a positive KrF resist mainly made of a polyhydroxystyrene resist protected with an acetal protecting group and bis(p-toluenesulfonyl)diazomethane (by Midorikagaku co.) as a photoacid generator. Then, the following three different compositions were prepared as shown in Table 2. In sample (c), a salt was the compound represented by formula (F):

(a) a composition prepared by adding a normal amount of quencher to a commercially available resist composition (quencher amount=1 in Table 2);

(b) a composition prepared by adding an excessive amount of quencher to a commercially available resist composition (quencher amount=5 in Table 2); and (c) a composition prepared by adding, in addition to a quencher, a salt to an amount of 0.05 mole per 1 kg of a resist polymer to a commercially available resist composition (quencher amount=1, an amount of the salt added=4 in Table 2).

Figure 9:
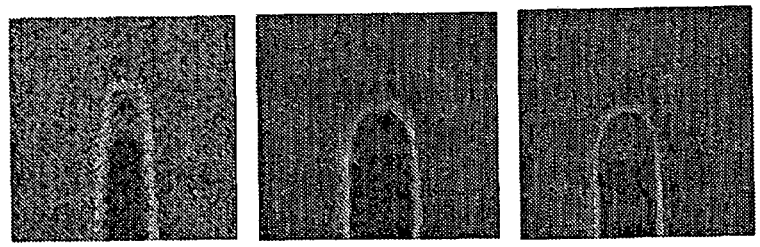
FIG. 9 shows an SEM photograph for an interconnection trench pattern in an example.
Figure 10:
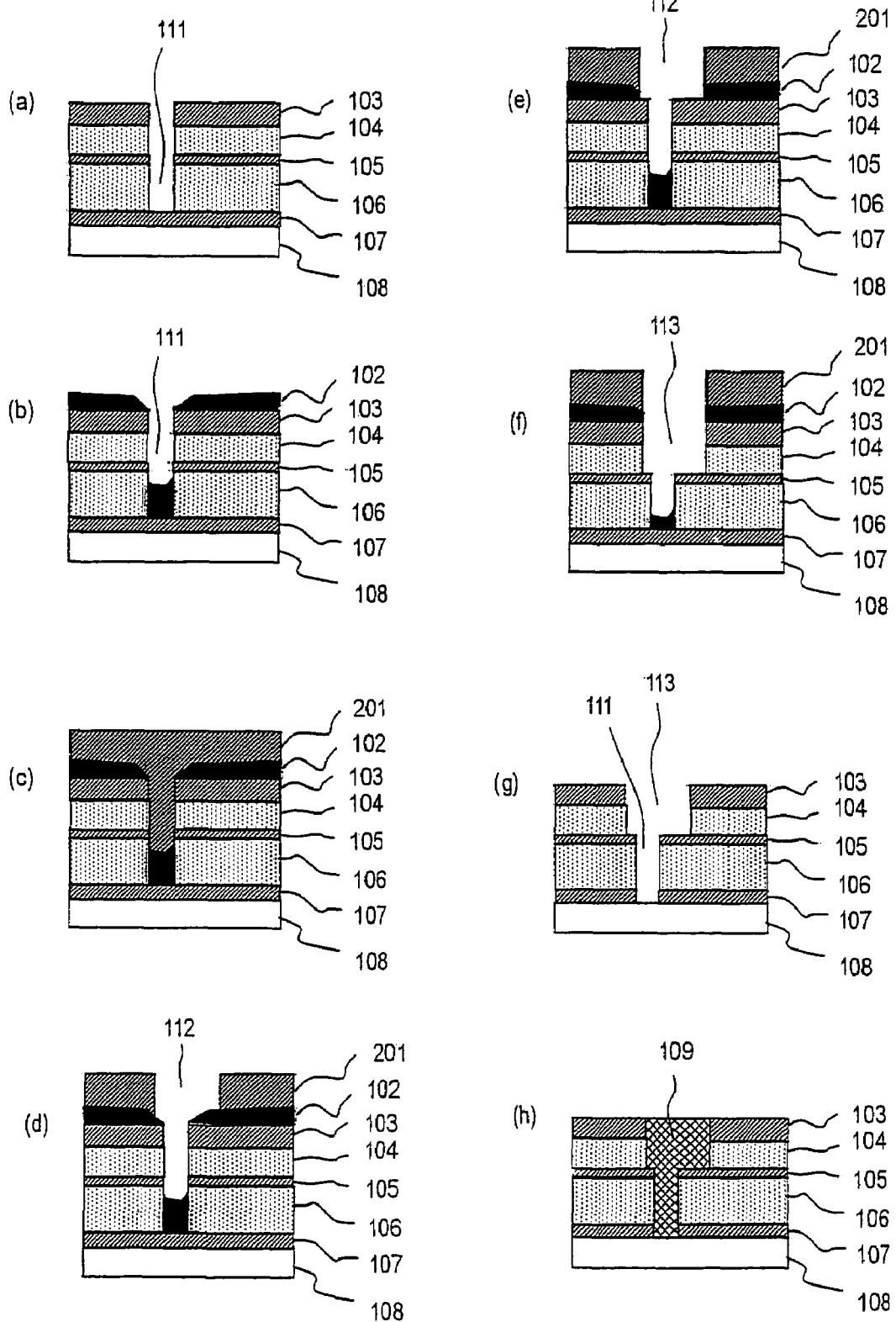
FIG. 10 is a cross-sectional view showing a process for manufacturing a semiconductor device according to the prior art.
Figure 11:
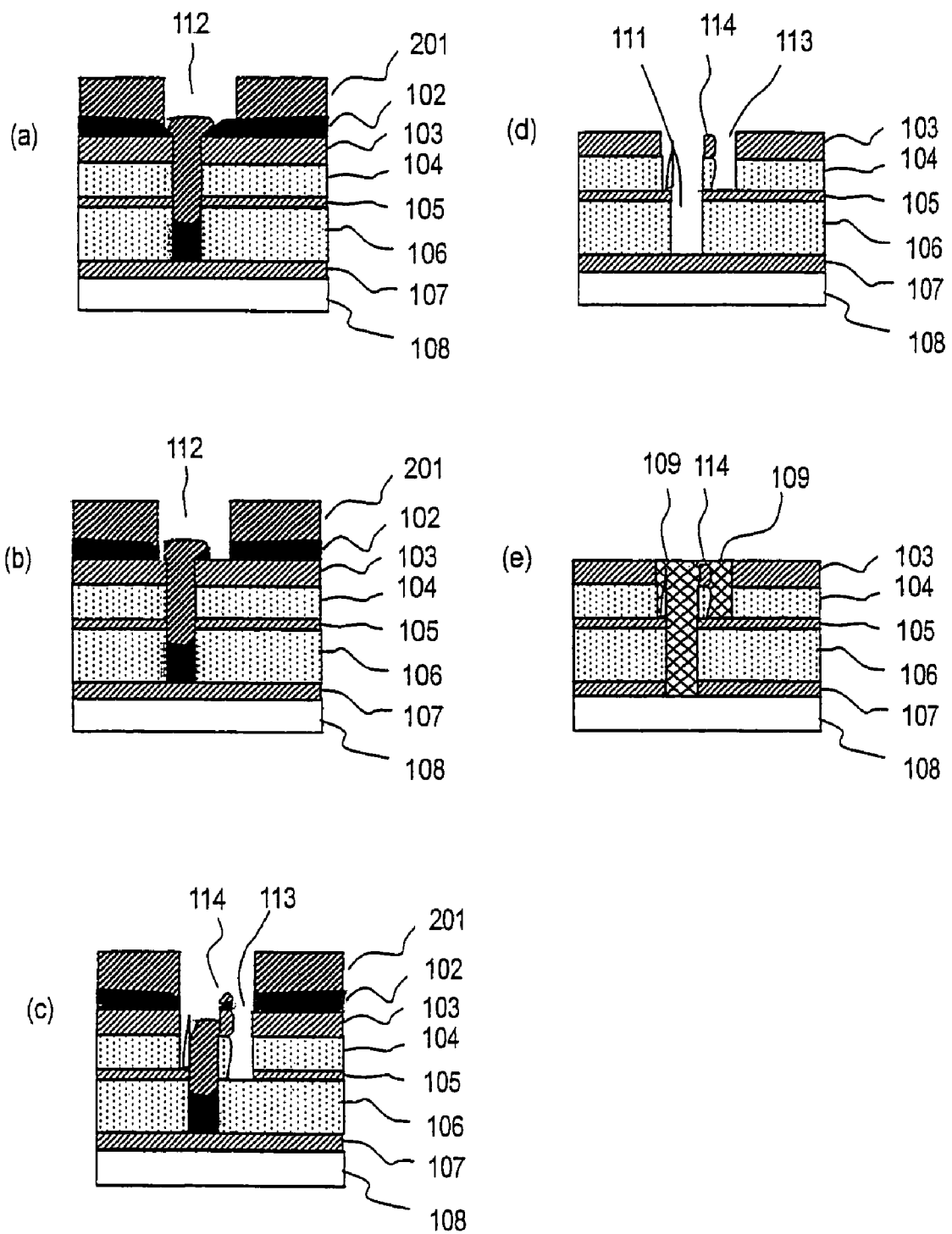
FIG. 11 is a cross-sectional view showing a process for manufacturing a semiconductor device according to the prior art.

Using each of samples from (a) to (c) as a chemically amplified resist 101, KrF laser exposure was conducted to form an interconnection trench pattern extending to one direction. The exposure conditions were NA=0.75, σ=0.75 and in normal mode. Table 2 shows the patterning conditions and the results. An interconnection trench pattern formed using a KrF resist was observed the resist pattern over a via by scanning electron microscopy (SEM). FIG. 9 shows the resulting SEM photograph.

For an ArF-exposure and an EB-exposure resists, compositions corresponding to (a) to (c) for each resist were also prepared and evaluated as well. Table 2 shows the patterning conditions and the results.

The ArF-exposure resist was mainly made of an acrylate type ArF resist and a triphenylsulfonium p-toluenesulfonate as a photoacid generator. In sample (c), the compound represented by formula (G) was used as a salt. Exposure was conducted using a KrF laser at a wavelength of 193 nm under the conditions of NA=0.72, σ=0.75 and in normal mode.

In terms of the EB-exposure resist, a negative resist was mainly made of a polyhydroxystyrene resist whose OH groups were protected as alkyl ether and a photoacid generator comprising bis(p-toluenesulfonyl)diazomethane and triphenylsulfonium p-toluenesulfonate. In sample (c), a salt was the compound represented by formula (H). Exposure was conducted by direct drawing with 100 KeV electron beam.

A positive resist was mainly made of a cresol novolac resin, a melamine crosslinking agent and a photoacid generator comprising bis(p-toluenesulfonyl)diazomethane and triphenylsulfonium p-toluenesulfonate. In sample (c), a salt was the compound represented by formula (H). Exposure was conducted by straight-writing drawing with 50 KeV electron beam.

TABLE 2

| Light source | Type | | Amount (Relative value) | | Pattern size (nm) | Exposure margin | Sensitivity/ | Resist poisoning in a via-first process |
|---|---|---|---|---|---|---|---|---|
| | | | Quencher | Salt | Line/Space | (CD ± 10%) | $cm^2$ | (3-layer resist process) |
| KrF excimer laser (248 nm) | Positive | a | 1 | 0 | 140/140 | 11% | 52 mJ | Defective resolution |
| | | b | 5 | 0 | 140/140 | 15% | 310 mJ | No defects |
| | | c | 1 | 4 | 140/140 | 16% | 40 mJ | No defects |
| ArF excimer laser (193 nm) | Positive | a | 1 | 0 | 100/100 | 16% | 30 mJ | Defective resolution |
| | | b | 5 | 0 | 100/100 | 21% | 160 mJ | No defects |
| | | c | 1 | 4 | 100/100 | 23% | 28 mJ | No defects |
| EB (100 KeV) | Negative | a | 1 | 0 | 100/100 | 8% | 9 μC | Defective resolution |
| | | b | 5 | 0 | 100/100 | 13% | 45 μC | No defects |
| | | c | 1 | 4 | 100/100 | 15% | 11 μC | No defects |
| ED (50 KeV) | Positive | a | 1 | 0 | 100/100 | 7% | 7 μC | Defective resolution |
| | | b | 5 | 0 | 100/100 | 14% | 36 μC | No defects |
| | | c | 1 | 4 | 100/100 | 24% | 6 μC | No defects |

Hole patterning was also evaluated as described for patterning of an interconnection trench. Table 3 shows the patterning conditions and the results.

TABLE 3

| Light source | Type | | Additive (Relative value) | | Pattern size (nm) | Exposure margin (CD ± 10%) | Sensitivity/ $cm^2$ |
|---|---|---|---|---|---|---|---|
| | | | Quencher | Salt | | | |
| KrF excimer laser (248 nm) | Positive | a | 1 | 0 | 140 | 10% | 60 mJ |
| | | b | 5 | 0 | 140 | 15% | 320 mJ |
| | | c | 1 | 4 | 140 | 15% | 56 mJ |
| ArF excimer laser (193 nm) | Positive | a | 1 | 0 | 120 | 17% | 25 mJ |
| | | b | 5 | 0 | 120 | 24% | 130 mJ |
| | | c | 1 | 4 | 120 | 25% | 24 mJ |

TABLE 3-continued

| Light source | Type | Additive (Relative value) | | Pattern size (nm) | Exposure margin (CD ± 10%) | Sensitivity/ cm$^2$ |
|---|---|---|---|---|---|---|
| | | Quencher | Salt | | | |
| EB (50 KeV) | Positive | a | 1 | 0 | 100 | 6% | 9 μC |
| | | b | 5 | 0 | 100 | 11% | 45 μC |
| | | c | 1 | 4 | 100 | 12% | 8 μC |

As seen from Tables 2 and 3, with a usual amount of a quencher, sensitivity was good, but an exposure margin was too small to attain adequate resolution. With an excessive amount of a quencher, an exposure margin was increased while sensitivity was lowered. In a system comprising both a quencher and a salt, sensitivity and resolution were good and an exposure margin was adequate.

FIG. 9(a) to (c) shows an SEM photograph after KrF excimer laser exposure using resist compositions (a) to (c), respectively. From FIG. 9(a), it can be observed that defective resolution due to resist poisoning occurred for a commercially available resist comprising a normal amount of a quencher. FIG. 9(b) indicates that when using a resist composition comprising an excess amount of a quencher, patterning was satisfactorily but sensitivity is not adequate, and thus there is room for improvement in the light of mass-productiveness. In contrast, FIG. 9(c) indicates that when adding, in addition to a quencher, a salt comprising a conjugate base to an acid, patterning was satisfactory and sensitivity was not deteriorated.

These results confirm that a resist comprising a quencher and a salt comprising a conjugate base to an acid can be used to prevent poisoning or sensitivity deterioration and to attain improved patterning.

As described above, according to this invention, a resist composition comprising a salt exhibiting buffer effect can be used to prevent poisoning in a chemically amplified resist.

What is claimed is:

1. A chemically amplified resist composition comprising:
   a base resin;
   a photoacid generator which generates an acid by exposure; and
   a salt exhibiting buffer effect in the base resin, wherein said salt exhibiting buffer effect generates an acid-base pair in a resist composition without neutralizing the acid generated by the photoacid generator and behaves as if it is a buffer.

2. The chemically amplified resist composition as claimed in claim 1, wherein the salt comprises an anion of the acid generated from the photoacid generator by exposure.

3. The chemically amplified resist composition as claimed in claim 1, wherein the salt is a sulfonate.

4. The chemically amplified resist composition as claimed in claim 1, wherein the salt is an amine salt.

5. The chemically amplified resist composition as claimed in claim 1, wherein the salt is a salt of an alkanolamine or alkoxyalkylamine with a sulfonic acid.

6. The chemically amplified resist composition as claimed in claim 1, wherein the base resin is a resin whose alkali solubility is changed by the action of the acid.

7. The chemically amplified resist composition as claimed in claim 1, wherein the salt exhibiting buffer effect is not decomposed by light irradiation.

* * * * *